United States Patent [19]
Otsuki et al.

[11] Patent Number: 5,714,774
[45] Date of Patent: Feb. 3, 1998

[54] TWO-GATE SEMICONDUCTOR POWER SWITCHING DEVICE

[75] Inventors: Masahito Otsuki; Katsunori Ueno, both of Kanagawa, Japan

[73] Assignee: Fuji Electric Co., Ltd., Kanagawa, Japan

[21] Appl. No.: 218,200

[22] Filed: Mar. 28, 1994

Related U.S. Application Data

[63] Continuation of Ser. No. 96,978, Jul. 27, 1993, abandoned.

[30] Foreign Application Priority Data

| Jul. 28, 1992 | [JP] | Japan | 4-200048 |
| Aug. 25, 1992 | [JP] | Japan | 4-225378 |
| Feb. 23, 1993 | [JP] | Japan | 5-032884 |

[51] Int. Cl.⁶ .................. H01L 29/74; H01L 31/111
[52] U.S. Cl. ............... 257/138; 257/133; 257/140; 257/147
[58] Field of Search ............... 257/133, 138, 257/139, 140, 147, 212, 378

[56] References Cited

U.S. PATENT DOCUMENTS

| 4,400,710 | 8/1983 | Nishizawa et al. | 257/268 |
| 5,315,134 | 5/1994 | Ogura et al. | 257/138 |

FOREIGN PATENT DOCUMENTS

| 0 219 995 A3 | 4/1987 | European Pat. Off. | 257/147 |
| 0340445 A1 | 11/1989 | European Pat. Off. | 257/133 |
| 0 424 710 A3 | 5/1991 | European Pat. Off. | 257/147 |
| 3824836 A1 | 2/1989 | Germany | 257/133 |
| 61-263163 | 11/1986 | Japan | 257/147 |

*Primary Examiner*—Steven H. Loke
*Attorney, Agent, or Firm*—Finnegan, Henderson, Farabow, Garrett & Dunner, L.L.P.

[57] ABSTRACT

In a semiconductor device, in addition to a first emitter layer, a second emitter layer is formed on the surface side of a p-type base in spaced-apart relation with the first emitter layer. The first emitter layer is the source region of a first MOSFET, while the second emitter layer is the source region of a second MOSFET. Through signals imparted to first and second gate electrodes, the device, when turned on, operates with a low on-state voltage drop in a thyristor state and, when turned off, undergoes a turn-off in a short time by changing to a transistor state. The main current in the transistor state flows by being offset toward the first emitter layer side with respect to a main-current path on the lower side of the second emitter layer in the thyristor state. Since the current paths in each mode are separated, it is possible to reduce the resistance in the current path in the transistor state without increasing the on-voltage, thereby making it possible to obtain a large latch-up withstand capability.

15 Claims, 25 Drawing Sheets

TWO-GATE SEMICONDUCTOR POWER SWITCHING DEVICE

This application is a continuation of application Ser. No. 08/096,978, filed Jul. 27, 1993, now abandoned.

BACKGROUND OF THE INVENTION

The present invention relates to a configuration of a MOS-type semiconductor device used as a power device or the like, and more particularly to a double-gate type semiconductor device having two gate electrodes.

As one of the most important key technologies for overcoming such problems as the needs for high performance, compact size, and low cost in power electronics, it is possible to point out the attempt to attain a low loss for power devices. In addition, development of devices with a low on-state voltage drop and a short turn-off time has been undertaken in various fields. For instance, in the case of bipolar transistors, an attempt has been made to attain high performance, high withstand voltage, capability and large current, and intelligent modules incorporating various protective functions have also appeared. Also, in the case of insulated gate bipolar transistors (IGBTs, i.e., conductivity-modulated transistors), those which have enabled high-speed response have also appeared. These power devices are adopted in electric appliances which are driven by batteries and are made compact to be carried, and in electric cars the adoption of which is being studied in the light of environmental protection, thereby playing a part in saving electricity. To cope with electric power demand which is increasing more and more in recent years, these power semiconductor devices have come to be required to further reduce their power losses.

For instance, a MOS gate controlled thyristor (MCT) has been developed for the purpose of reducing the on-state voltage drop by the adoption of a thyristor structure and for the purpose of attaining high speed and low driving power by means of a MOS gate device. This MCT is a device which has a configuration and an equivalent circuit, as shown in FIGS. 31 and 32, and is detailed in such a paper ("MOS controlled thyristors" IEEE International Electron Device Meeting Digest 1984) presented by V.A.K. Temple. An MCT 60 has an ON-gate channel 62a and an OFF-gate channel 62b which are controlled by a single gate electrode 61. If the ON-gate channel 62a is made conductive and the OFF-gate channel 62b is cut off, an npnp thyristor, which comprises an n$^+$ cathode layer 64 with a cathode electrode 63 disposed thereon, a p$^-$ base layer 65, an n base layer 66, and a p$^+$ anode layer 67 with an anode electrode 68 disposed thereon, is turned in an on state. Then, if the OFF-gate channel 62b is made conductive and the ON-gate channel 62a is cut off, the n base layer 66 and the anode electrode 68 are shortcircuited, and a pnp transistor 69 comprising the p$^-$ base layer 65, the n base layer 66, and the p$^+$ anode layer 67 is turned off, so that this device is turned in an off state. Thus, since the device is turned on by the MOSFET, the MCT 60 has a fast response speed, and since the thyristor is turned in the on state, its on-state voltage drop is very low at about 1 V. However, as shown in FIG. 33, the carrier concentration of holes and electrons which are present in the anode layer 67 and the base layers 65, 66 in the thyristor state, is high. Accordingly, the turn-off time is very long at 2 to 3μ seconds due to such a very high carrier concentration, and the power loss during this time becomes a problem. In particular, its power loss substantially increases in high-frequency applications.

Meanwhile, in an IGBT 80 shown in FIG. 34, its typical waveform during its turn-off is shown in FIG. 35. As can be seen from FIG. 35, the waveform during the turn-off time includes a first phase 91 and a second phase 92. The first phase 91 shows a phenomenon in which a channel due to a gate 87 disappears, and the supply of an electron current from an emitter electrode 88 to an n$^-$ base layer 82 stops, so that the current decreases instantaneously by that portion. The second phase 92 shows a phenomenon in which carriers remaining in the n$^-$ base layer 82 flow through the action of the pnp transistor constituted by a p$^+$ collector layer 81, the n$^-$ base layer 82, and a p base layer 83, and decrease as a result of recombination and disappearance due to the lifetime τ of the carriers. Accordingly, to shorten the turn-off time of the IGBT, it suffices if the injection level of the hole current is decreased, or the lifetime τ of the carriers is shortened. For this purpose, there has been proposed a technique for controlling the injection level of hole current by forming an n$^+$ buffer layer between the p$^+$ collector layer 81 and the n$^-$ base layer 82 (refer to IEEE, IEDM Technical Digest, 4.3 (1983) pp. 79–82) or a technique for controlling the concentration in the collector layer 81.

In addition, as the technique for shortening the lifetime τ of the carriers, there has been proposed a technique in which a lifetime control process such as electron beam irradiation or heavy metal diffusion is applied (refer to IEEE, Trans. Electron Devices, ED-31 (1984) pp. 1790–1975). Thanks to these techniques, it has become possible to reduce the fall time during a turn-off down to 200 n seconds, rendering the device capable of coping with the high frequency. It should be noted that the techniques concerning this IGBT 80 are detailed in a treatise ("New IGBT Modules with Improved Power Loss at High Frequency PWM Mode" Electronica '90 Munchen).

Thus, although the IGBT 80 has the advantage of a short turn-off time, it is a device for which it is difficult to reduce the on-state power loss since its on-voltage is high at about 2 V and since the concentration in the p base layer 83 cannot be made high to prevent latch-up state through operation of a parasitic thyristor. It should be noted that, as stated in FIG. 34, the emitter current is $I_E = I_h + I_{MOS}$, and the following formula holds if it is assumed that the gain of the pnp transistor comprising the p base layer 83, the n$^-$ base layer 82, and the p$^+$ collector layer 81 is $a_{PNP}$:

$$I_h = (a_{PNP}/(1-a_{PNP}))I_{MOS}$$

Accordingly, the following formula holds:

$$I_E = (1/(1-a_{PNP}))I_{MOS}$$

Ih (hole current) undergoes a change due to the value of $a_{PNP}$, i.e., the current of the IGBT 80 changes. Where, $I_{MOS}$ is an electron current.

Furthermore, devices having the features of both the MCT and the IGBT, i.e., having a low on-state voltage drop and, at the same time, a short turn-off time, have been developed in recent years, and positive progress has thus been made in improvement of the performance of power devices. As disclosed in Japanese Patent Application Unexamined Publication Nos. Hei. 3-136371 and Hei. 3-145163, such semiconductor devices are arranged so that a plurality of independent gate controlled electrodes are provided so as to be capable of selecting their operating physics. FIG. 36 shows one of their examples. It should be noted that FIG. 37(a) shows a diagram of current flow in the thyristor state of the semiconductor device shown in FIG. 36, and FIG. 37(b)

shows a diagram of current flow in the transistor state thereof. A semiconductor device 90 shown in FIG. 36 is characterized by having a pnpn thyristor structure comprising a p$^+$ collector layer 92 with a collector electrode 91 disposed thereon, an n$^-$ base layer 93 formed on that p$^+$ collector layer 92 through epitaxial growth, a p base layer 94 diffusion-formed on the obverse surface side of the n$^-$ base layer 93, and an n$^+$ emitter layer (source layer) 95 and an n$^+$ drain layer 96 which are formed on the obverse surface side of the p base layer 94 by means of n$^+$-type wells, and by having two gate electrodes, a first gate electrode 97 and a second gate electrode 98 which can be controlled independently from each other. The first gate electrode 97 of these gate electrodes is capable of connecting together the n$^+$ emitter layer 95 and the n$^-$ base layer 93 by using the p-type base layer 94 as a back gate, and controls the turn-on of this device.

In contrast, the second gate electrode is capable of connecting together the p base layer 94 and the n$^+$ emitter layer 95 via a shortcircuiting electrode 100 and the n$^+$ drain layer 96, and controls the turn-off of this device. In such a semiconductor device 90, if the first gate electrode 97 is turned on, electrons are injected from the p$^+$ emitter layer 95 into the n$^-$ base layer 93, and holes are injected from the collector layer 92 into the n$^-$ base layer 93 correspondingly. Accordingly, a transistor constituted by the p$^+$ collector layer 92, the n$^-$ base layer 93, and the p base layer 94 is turned on. As a result, holes are injected into the p base layer 94, and a transistor constituted by the n$^-$ base layer 93, the p base layer 94, and the n$^+$ emitter layer 95 is turned on. Accordingly, since a thyristor constituted by the p$^+$ collector layer 92, the n$^-$ base layer 93, the p base layer 94, and the n$^+$emitter layer 95 is turned on, this device 90 operates at a low on-state voltage drop similar to that of the MCT in the on state. In this state, if the second gate electrode 98 is turned on, the holes in the p base layer 94 are transformed into electrons in the shortcircuiting electrode 100, and current flows from the n$^+$ drain layer 96 to an emitter electrode 99 via a channel on the surface of the p base layer 94 immediately below the second gate electrode 98 and via the n$^+$ emitter layer 95. For this reason, since the holes are drawn out from the p-type base layer 94, the transistor constituted by the n$^-$ base layer 93, the p base layer 94, and the n$^+$ emitter layer 95 is turned off, with the result that the operation of the device changes from the thyristor state to the transistor state similar to that of the IGBT. Accordingly, it is possible to reduce the turn-off time when this semiconductor device 90 is turned in the off state by turning off the first gate electrode 97.

However, with the above-described semiconductor device 90, the overall device is turned in the off state after the operation mode is changed from the thyristor state to the transistor state, so that there is the problem that a latch-up due to a parasitic thyristor is liable to occur in the same way as the aforementioned IGBT. For this reason, in the semiconductor device 90, there is a limit to the maximum current which is allowed in the transistor state, thereby causing a hindrance in the practical use of the device. Namely, as is apparent from the diagram of current flow in the thyristor state and in the transistor state of the semiconductor device 90 as shown in FIG. 37, the main current flows through the p base layer 94 on the lower side of the emitter electrode 99 in each of the operating states. In particular, if we look at the path of hole current in the transistor state of the semiconductor device 90 shown in FIG. 37(b), after flowing from the lower side of the first gate electrode 97 into the p base layer 94, the hole current enters the shortcircuiting electrode 100 by detouring the lower side of the emitter electrode 99 and flows out to the emitter electrode 99 via the n$^+$ drain layer 96 and the n$^+$ emitter layer 95. In this device 90 having the above-described structure, if a large hole current for drawing out flows with respect to the diffusion resistance (base resistance) of the p base layer 94 beneath the emitter layer 95, owing to a voltage drop due to that current, its current becomes a trigger current of an npn transistor constituted by the n$^-$ base layer 93, the p base layer 94, and the n$^+$ emitter layer 95. As a result, since this npn transistor is turned on, the device as a whole returns to the thyristor state existing before the second gate electrode 98 is turned on, thereby losing the turn-off capability. A description will be given of this manner with reference to FIG. 38. First, as shown in FIG. 38(a), during the thyristor operation, the main current flows in a region 94a of the p base layer 94 below the emitter electrode 99. Meanwhile, during the transistor operation as shown in FIG. 38(b), as the second gate electrode 98 is turned on, the hole current is drawn out via the region 94a below the emitter electrode 99. Accordingly, both during the thyristor operation and the transistor operation, the current path of the hole current is shared in the region 94a below the emitter electrode 99.

To suppress a latch-up in this transistor state (to increase a controllable current until a latch-up), it is effective to increase the impurity concentration in the p base layer 94 so as to reduce the resistance value of its base resistance $R_B$. Since the amount of voltage drop due to the hole current drawn out can be suppressed, it is possible to increase the current value until a latch-up. However, an increase in the impurity concentration in the p base layer 94 results in an increase in the on-state voltage in the thyristor state. Accordingly, with the device having the structure shown in FIG. 36, there remains a mutually incompatible problem between the reduction of the on-state voltage during the thyristor state and the increase of the latch-up current during the transistor state.

SUMMARY OF THE INVENTION

Accordingly, in view of the above-described problems, it is an object of the present invention to to realize a device which permits a low on-state voltage drop and high-speed switching, and makes it possible to process a large latch-up current and to obtain a current capacity for practical purposes, by adopting a novel structure in which the current paths in the thyristor state and the transistor state are separated.

To overcome the above-described problems, in the present invention, a novel device which is capable of selecting the operating physics in which the device, when turned on, assumes a thyristor state in the same manner as an MCT and, when turned off, assumes a transistor state in the same manner as an IGBT, and which is capable of controlling a large current as compared with a known conventional-type device. Namely, in accordance with the present invention, there is provided a semiconductor device having a thyristor structure constituted by a first semiconductor region of a first conductivity type, a second semiconductor region of a second conductivity type, a third semiconductor region of the first conductivity type, and a fourth semiconductor region of the second conductivity type, and the semiconductor device comprising a first MISFET capable of injecting majority carriers into the second semiconductor region of the second conductivity type and a second MISFET capable of being opened or closed independently of the first MISFET and capable of drawing out the majority carriers from the third semiconductor region of the first conductivity type, characterized in that the fourth semiconductor region of the second conductivity type is separated into a source region of the first MISFET and a source region of the second MISFET formed independently at a position spaced apart from that source region. By forming an independent and separate source region of the second MISFET, it becomes possible to form the drain region of the second MISFET between the source region of the first MISFET and the source region of the second MISFET. Furthermore, short-circuiting means for making conductive both the drain region of the second MISFET and the third semiconductor region may be provided between the source region of the first MISFET and the drain region of the second MISFET. As this shortcircuiting means, it is possible to use a shortcircuiting electrode which electrically contacts with the drain region of the second MISFET and the main surface of the third semiconductor region.

As the structure of the third semiconductor region, a high-concentration semiconductor region of the first conductivity type may be disposed between a region where the gate electrode of the first MISFET is disposed and a region where the gate electrode of the second MISFET is disposed. Furthermore, the third semiconductor region is preferably constituted by the semiconductor region where the gate electrode of the first MISFET is disposed, the high-concentration semiconductor region of the first conductivity type, and the semiconductor region where the gate electrode of the second MISFET is disposed, and relationships of impurity concentrations are preferably adjusted such that the concentration of the high-concentration semiconductor region > the concentration of the semiconductor region where the gate electrode of the first MISFET is disposed ≧ the concentration of the semiconductor region where the gate electrode of the second MISFET is disposed. Preferably, the dosage in the third semiconductor region of the first conductivity type is not less than $6 \times 10^{12}$ cm$^{-2}$ and not more than $1.2 \times 10^{14}$ cm$^{-2}$. In addition, the diffusion depth of the third semiconductor region is preferably not less than 2 μm and not more than 8.5 μm. In particular, the dosage in the high-concentration semiconductor region of the first conductivity type is preferably not less than $1 \times 10^{13}$ cm$^{-2}$ and not more than $1 \times 10^{16}$ cm$^{-2}$. Meanwhile, it suffices if the diffusion depth of the source region of the first MISFET is not more than 1.1 μm.

As an optional structure, voltage increasing means may be provided for increasing the potential of the source region of the first MISFET by a predetermined potential as compared with the potential of the second MISFET. As a specific structure of the voltage increasing means, a high-resistance polycrystalline silicon layer connected to the source region of the first MISFET may be used. Alternatively, the voltage increasing means may be a diffusion resistance of the source region itself of the first MISFET. Still alternatively, the voltage increasing means may be a Schottky contact constituted by the source region of the first MISFET and a metal electrode formed thereon.

Meanwhile, although a polysilicon gate would be generally used as the gate electrode of the second MISFET, here a metal gate or a silicide gate is preferable.

As the chip layout or the cell configuration of this device, it is possible to adopt various patterns as described below. Namely, an arrangement may be adopted in which there are provided a first gate main wiring disposed along one side of a chip, a second gate main wiring disposed along an opposing side of the chip, a first branch line in the form of comb teeth branching out from the first gate main wiring, and a second branch line in the form of comb teeth branching out from the first gate main wiring, wherein two strips of the second branch line are placed between adjacent two strips of the first branch line, the first branch line being the gate electrode of the first MISFET, and the second branch line being the gate electrode of the second MISFET. As another cell configuration, it is possible to adopt an arrangement in which there are provided a first gate main wiring disposed along one side of a chip, a second gate main wiring disposed along an opposing side of the chip; a first branch line in the form of comb teeth branching out from the first gate main wiring, and a second branch line in the form of comb teeth branching out from the first gate main wiring, and wherein the gate electrode of the second MISFET for each cell has a ring-shaped configuration connected to the second branch line, the gate electrode of the first MISFET for each cell being connected to the first branch line and being formed in such a manner as to surround an outer side of the gate electrode of the second MISFET in the ring-shaped configuration. As still another cell configuration, it is possible to adopt an arrangement in which there are provided a first gate main wiring disposed along one side of a chip, a second gate main wiring disposed along an opposing side of the chip; a first branch line in the form of comb teeth branching out from the first gate main wiring, and a second branch line in the form of comb teeth branching out from the first gate main wiring, and wherein the gate electrode of the first MISFET for each cell is connected to the first branch line, the gate electrode of the second MISFET for each cell being connected to the second branch line and being formed in such a manner as to surround an outer side of the gate electrode of the first MISFET.

In the above-described cell configuration, the gate electrode of the first MISFET for each cell may be formed in the configuration of a ring.

As the wiring structure of this device, the source electrode wiring of the first MISFET and the source electrode wiring of the second MISFET may be formed by a single-layered wiring structure of an identical layer. Alternatively, the source electrode wiring of the first MISFET and the source electrode wiring of the second MISFET may be formed by a two-layered wiring structure of different layers.

In the semiconductor device in accordance with the present invention in which the above-described means are provided, in a state in which anode potential (collector potential) is being applied to the first conductivity-type first semiconductor region, and cathode potential (emitter potential) is being applied to the second conductivity-type fourth semiconductor region, if the first MISFET is turned in the on state, majority carriers are injected from the source region of the first MISFET into the second conductivity-type second semiconductor region, and minority carriers are correspondingly injected from the first conductivity-type first semiconductor region into the second conductivity-type second semiconductor region. Accordingly, a transistor constituted by the first conductivity-type first semiconductor region, the second conductivity-type second semiconductor region, and the first conductivity-type third semiconductor region is turned in the on state. As a result, majority carriers are injected into the first conductivity-type third semiconductor region and, at the same time, a transistor constituted by the second conductivity-type second semiconductor region, the first conductivity-type semiconductor region, and the second conductivity-type fourth semiconductor region is turned in the on state. Accordingly, a thyristor constituted by the first conductivity-type first semiconductor region, the second conductivity-type second semiconductor region, the first conductivity-type third semiconductor region, and the second conductivity-type fourth semiconductor region is turned in the on state. Consequently, it is possible to lower the on-state voltage drop. Meanwhile, if the second MISFET is turned in the on state, majority carriers in the first conductivity-type third semiconductor region flow out from the source region of the second conductivity type via the second conductivity-type drain region of the second MISFET, so that the transistor constituted by the second conductivity-type second semiconductor region, the first conductivity-type third semiconductor region, and the second conductivity-type fourth semiconductor region is turned in the off state. Consequently, the device undergoes a change from the thyristor state to the transistor state similar to the IGBT, and the carrier concentration in the device decreases. Accordingly, it is possible to reduce the turn-off time when the first MISFET is turned in the off state and this semiconductor device is turned in the off state.

In addition, the semiconductor device in accordance with the present invention is characterized in that it allows a low on-state voltage drop and high-speed switching, as described above, and that it is capable of processing a large latch-up current in the transistor state by separating the main-current path in the thyristor state and the main-current path in the transistor state. Namely, since the second emitter region acts as the cathode of a thyristor in the thyristor state of the device, the main current flows rectilinearly from a region immediately below the source region of the second MISFET toward the first conductivity-type first semiconductor region side. In contrast, in the transistor state of the device, majority carriers in the second conductivity-type second semiconductor region pass through the first MISFET and flow out toward the cathode electrode in its source region. Meanwhile, minority carriers flow from the first MISFET side into the first conductivity-type third semiconductor region and flow out from its source region toward the cathode electrode side via a junction with the second conductivity-type drain region and the second MISFET. Therefore, the main-current path immediately below the source region of the second MISFET in the thyristor state is not used jointly. Accordingly, since the current path in the transistor state is provided with a low resistance, it is possible to suppress a latch-up, and it therefore becomes possible to process a large current. In addition, high stability in the transistor state is ensured.

In addition, in a case where the second conductivity-type drain region is formed between the source region of the first MISFET and the source region of the second MISFET which are formed in mutually spaced-apart relation, the path of outflow of the hole current from the first conductivity-type third semiconductor region to the source region of the second MISFET is shortened, so that it is possible to increase the capability of the device to withstand the latch-up, thereby making it possible to further improve the turn-off characteristics.

Furthermore, since the first conductivity-type high-concentration semiconductor region is formed between the region where the first MISFET gate electrode is disposed and the region where the second MISFET gate electrode is disposed within the first conductivity-type third semiconductor region, it is possible to further reduce the resistance in the outflow of majority carriers, and it is possible to increase the maximum current which is allowable in the transistor state. In addition, it is possible to reduce the time duration for a transition from the thyristor state to the transistor state, and the turn-off time of the device can be reduced further.

In a case where the third semiconductor region is constituted by the semiconductor region where the gate electrode of the first MISFET is disposed, the high-concentration semiconductor region of the first conductivity type, and the semiconductor region where the gate electrode of the second MISFET is disposed, and the relationships of impurity concentrations are set such that the concentration of the high-concentration semiconductor region > the concentration of the semiconductor region where the gate electrode of the first MISFET is disposed $\geq$ the concentration of the semiconductor region where the gate electrode of the second MISFET is disposed, then threshold values and the like of the first MISFET and the second MISFET can be controlled individually. Hence, the characteristics of the device in both the thyristor state and in the transistor state improve. For instance, if the impurity concentration in the region where the gate electrode of the first MISFET is disposed is made higher than the impurity concentration in the region where the gate electrode of the second MISFET is disposed, it is possible to lower the resistance in the outflow of majority carriers, with the result that a controllable current can be increased, and high-speed turn-off becomes possible.

DETAILED DESCRIPTION OF THE INVENTION

Figure 1:
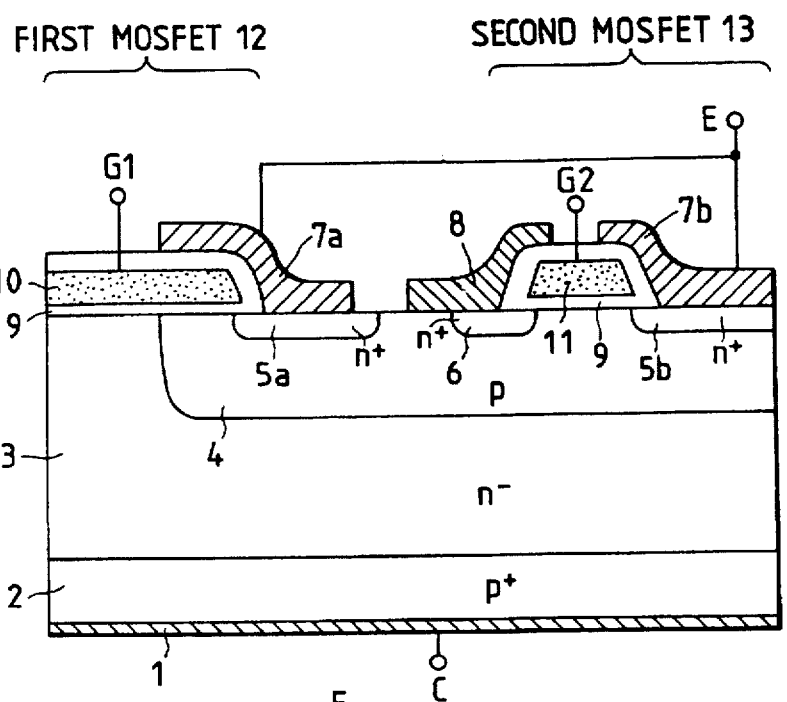
FIG. 1 is a cross-sectional view illustrating a configuration of a semiconductor device in accordance with a first embodiment of the present invention.

Referring now to the drawings, the preferred embodiments of the present invention will be described.

[First Embodiment]

FIG. 1 shows a configuration of a semiconductor device having a double-gate structure of a first gate and a second gate in accordance with a first embodiment of the present invention. The semiconductor device of this embodiment is arranged such that a $p^+$-type (first conductivity type) semiconductor substrate with a collector electrode (anode electrode.) 1 disposed on the rear surface thereof is used as a collector layer 2, and an n⁻type (second conductivity type) base layer 3 is formed on this collector layer 2 through epitaxial growth. It should be noted that an $n^+$-type buffer layer may be provided between the collector layer 2 and the base layer 3. A base layer 4 in the form of a p-type well is diffusion-formed on the surface of this n⁻type base layer 3. Furthermore, a first emitter layer 5a, a second emitter layer 5b, and a drain layer 6 which are in the form of three independent $n^+$-type wells are respectively formed on the inner surface of this p-type base layer 4. Among them, the $n^+$-type emitter layers 5a and 5b are connected to each other via emitter electrodes 7a and 7b, while a shortcircuiting electrode 8 is connected to the p-type base layer 4 and the $n^+$-type drain layer 6 in such a manner as to straddle them. A first gate electrode 10 formed of polycrystalline silicon and constituting a first MOSFET 12 covers a region extending from the surface of the $n^+$-type emitter layer (first emitter layer) 5a to the surfaces of the p-type base layer 4 and the n⁻-type base layer 3 via a gate oxide film 9. Meanwhile, a second gate electrode 11 formed of polycrystalline silicon and constituting a second MOSFET 13 covers a region extending from the surface of the $n^+$-type drain layer 6 to the surfaces of the p-type base layer 4 and the $n^+$-type emitter layer (second emitter layer) 5b via the gate oxide film 9. The first gate electrode 10 and the second gate electrode 11 are independently controllable. It should be noted that the first MOSFET 12 constituted by the first gate electrode 10 and the second MOSFET 13 constituted by the second gate electrode 11 are both n-channel type MOSFETs.

Figure 2:
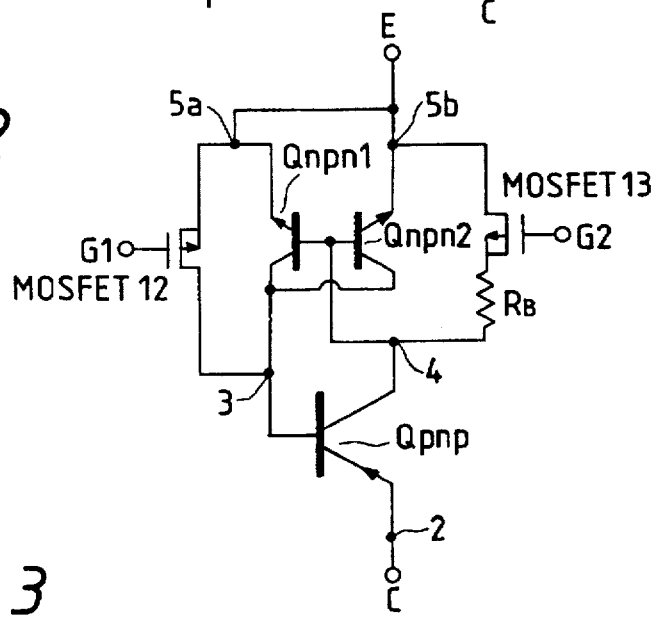
FIG. 2 is a circuit diagram illustrating an equivalent circuit of the semiconductor device of the first embodiment.

FIG. 2 shows an equivalent circuit of this device. In this device, an npn-type transistor Qnpn1 is formed by the $n^+$-type first emitter layer 5a, the p-type base layer 4, and the $n^-$-type base layer 3, while an npn-type transistor Qnpn2 is formed by the $n^+$-type second emitter layer 5b, the p-type base layer 4, and the $n^-$-type base layer 3. In addition, a pnp-type transistor Qpnp is formed by the p-type base layer 4, the $n^-$-type base layer 3, and the $p^+$-type collector layer 2. Accordingly, a thyristor structure is formed by the transistors Qnpn1 and Qnpn2 connected in parallel and having different emitter layers, as well as the transistor Qpnp. With respect to these transistors Qnpn1, Qnpn2, and Qpnp, the first MOSFET 12 connects together the n-type base layer 3, serving as the collector of the transistor Qnpn1, and the first emitter layer 5a via the p-type base layer 4, and injects electrons into the n-type base layer 3. In addition, the second MOS 13 connects together the drain layer 6 and the second emitter layer 5b, and draws holes out of the base layer 4.

In this device having the above-described construction, if the first gate electrode 10 is set to a high potential while no potential is being applied to the second gate electrode 11 or negative potential is being applied thereto, the surface of the p-type base layer 4, which is located immediately below the first gate electrode 10 and serves as a back gate, becomes an n-type inversion layer, so that connection is established from the emitter electrode 7a to the n-type emitter layer 5a serving as a source, the n-type inversion layer immediately below the first gate electrode 10, and the $n^-$-type base layer 3 serving as a drain. Accordingly, electrons are injected from the emitter electrode 7a to the $n^-$-type base layer 3 which is a drift region, and holes are injected from the $p^+$-type collector layer 2 correspondingly. This means that the pnp-type transistor Qpnp is turned in the on state. Furthermore, since the hole current of this transistor Qpnp becomes the base current of the transistors Qnpn1 and Qnpn2, the transistors Qnpn1 and Qnpn2 are turned in the on state. Namely, the thyristor constituted by the $p^+$-type collector layer 2, the $n^-$-type base layer 3, the p-type base layer 4, and the $n^+$-type emitter layers 5a and 5b is turned in the on state, so that high-concentration carriers are present in the device, and this device assumes a low resistance. Thus, this device is set in the thyristor state in the same manner as the above-described MCT by setting the first gate electrode 10 to high potential while the second gate electrode 11 is set to zero potential, so that a power device with a low on-voltage is obtained.

In this state, if the second gate electrode 11 is set to high potential while the first gate electrode 10 is kept in high potential, the second MOSFET 13 is also turned in the on state, so that the surface of the p-type base layer 4 immediately below the second gate electrode 11 is inverted to n-type. Here, holes flowing in the p-type base layer 4 correspond to electron flow in the reverse direction in the shortcircuiting electrode 8, so that the p-type base layer 4, the shortcircuiting electrode 8, the $n^+$-type drain layer 6, the n-type inversion layer immediately below the second gate electrode 11, and the $n^+$-type emitter layer 5b are set in a conductive state. For this reason, the hole current injected from the $p^+$-type collector layer 2 via the p-type base layer 4 corresponds to electron flow via the shortcircuiting electrode 8; and current flows out to the emitter electrode 7b (electrons flow in the reverse direction). Accordingly, the transistors Qnpn1 and Qnpn2 are turned in the off state. Consequently, the thyristor operation disappears, and the device is set in the transistor state in which only the transistor Qpnp operates. This state is similar to the operating state of the IGBT described earlier, and is a state in which the concentration of carriers which are present in the device is reduced. For this reason, at a subsequent turn-off when the first gate electrode 10 is set to negative potential, the time required in sweeping the carriers can be reduced, thereby making it possible to shorten the turn-off time.

Figure 3:
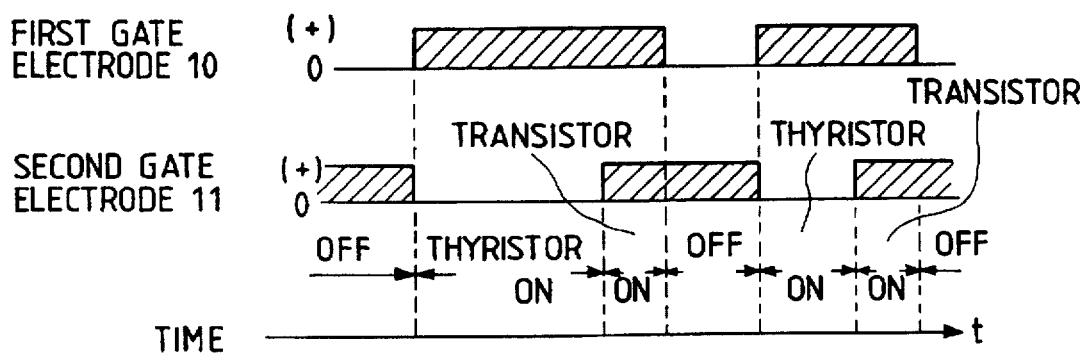
FIG. 3 is an explanatory diagram illustrating the operating state of the semiconductor device of the first embodiment.

FIG. 3 shows potential applied to the first gate electrode 10 and the second gate electrode 11. As shown, in the state in which zero potential is being applied to the first gate electrode 10 and high potential to the second gate electrode 11, this device is in the off state. If high potential is first applied to the first gate electrode 10, this device is set to the on state, and if zero potential is applied to the second gate electrode 11 in this state, the device changes to the thyristor state at a speed of about 0.2μ second and shows a low on-state voltage drop of about 1 V in this thyristor state. Then, if high potential is applied to the second gate electrode 11, the device changes to the transistor state at a speed of about 0.5μ second. If zero potential is applied to the first gate electrode 10 in this state, the device is turned off with a short turn-off time about 0.5μ second. Thus, this device during an on state operates with a low on-state voltage drop in the same manner as the MCT, and the device, when turned off, is turned in the off state with a short turn-off time in the same manner as the IGBT. Accordingly, as shown in FIG. 3, by repeating the thyristor state and the transistor state, it is possible to realize a power device having a small switching loss in applications to high frequency as well.

Figure 4A:
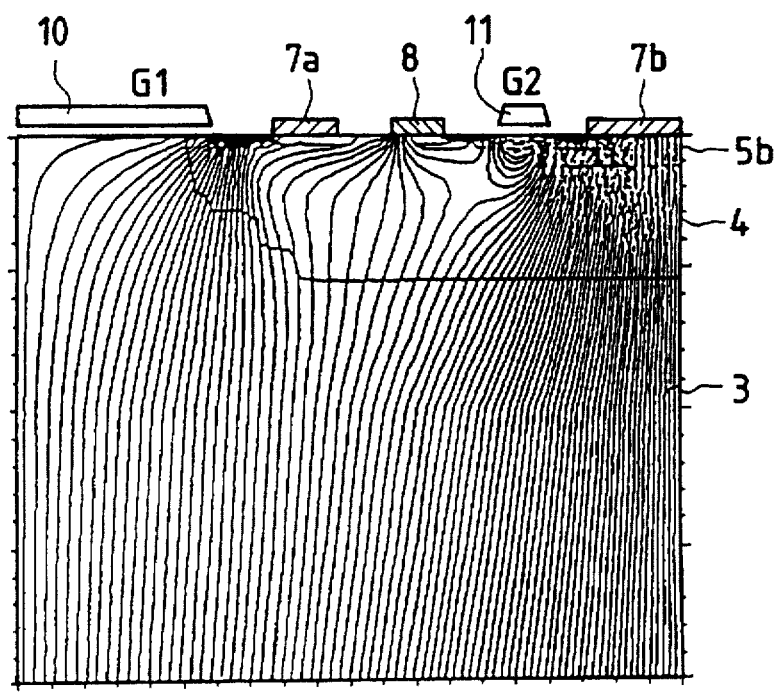
FIG. 4(a) is a cross-sectional view illustrating the flow of current in the thyristor state of the semiconductor device of the first embodiment.
Figure 4B:
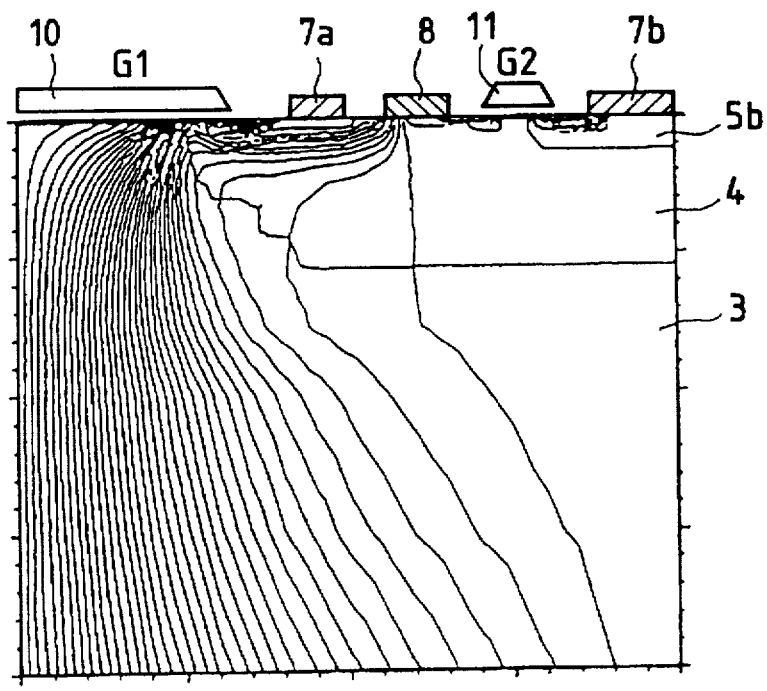
FIG. 4(b) is a cross-sectional view illustrating the flow of current in the transistor state of the semiconductor device of the first embodiment.
Figure 5A:
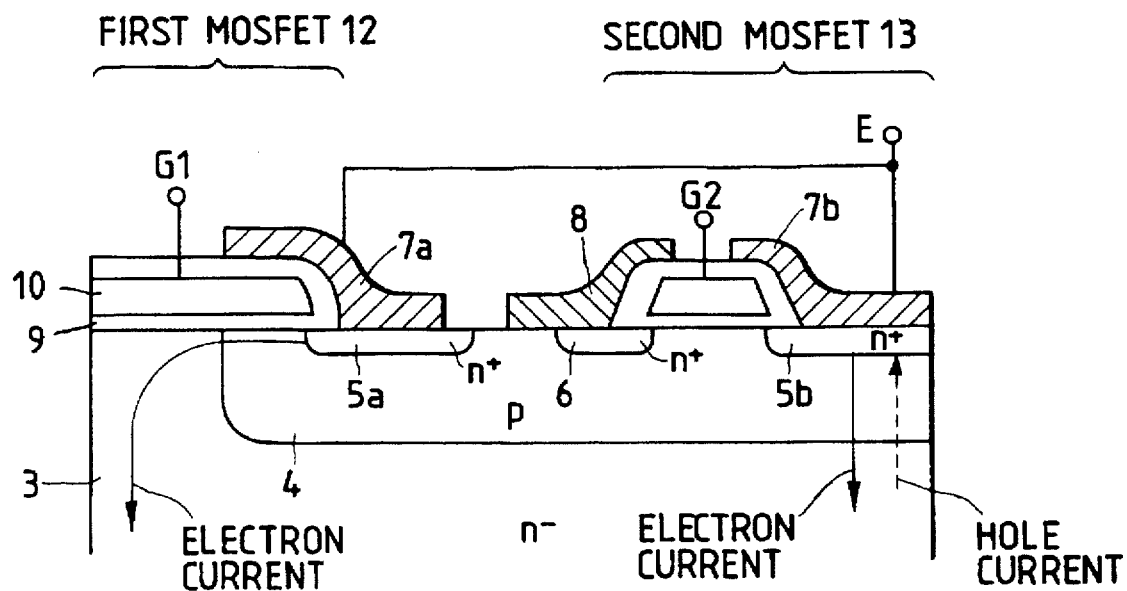
FIG. 5(a) is a cross-sectional view illustrating the flow of electron current and hole current in the thyristor state of the semiconductor device of the first embodiment.
Figure 5B:
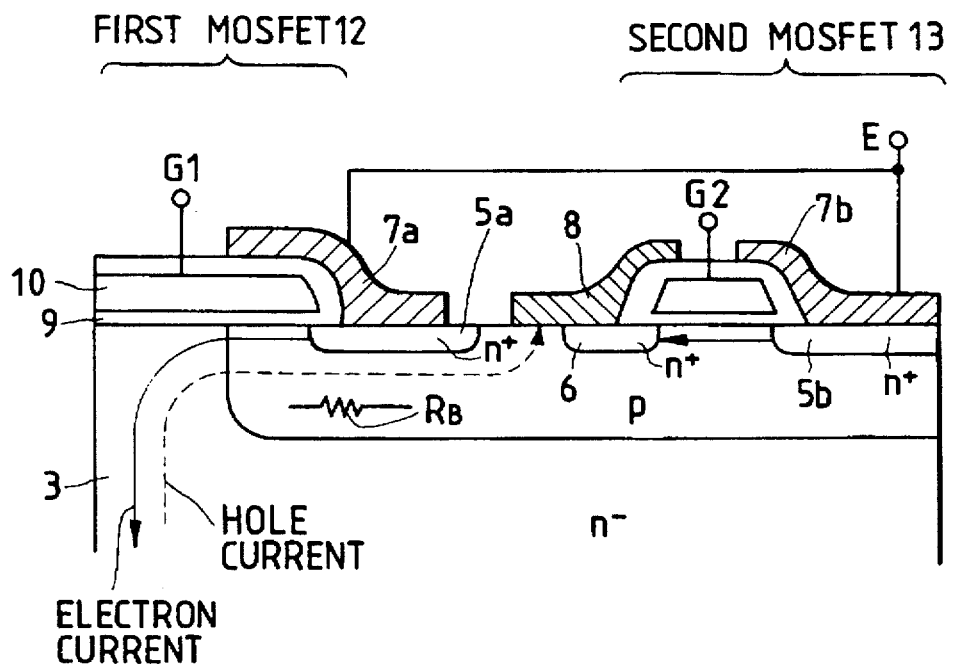
FIG. 5(b) is a cross-sectional view illustrating the flow of electron current and hole current in the transistor state of the semiconductor device of the first embodiment.

Next, current flow and carrier concentration in the thyristor state and the transistor state of this device will be described, respectively. FIGS. 4(a) and 4(b) show diagrams of current flow in the thyristor state and the transistor state. In the thyristor state shown in FIG. 4(a), the hole current and the electron current flow in a united manner from the emitter electrodes 7a and 7b to the p-type base layer 4 and the $n^-$-type base layer 3, and it can be appreciated that the thyristor operation is achieved. In particular, the main current is concentrated on the lower side of the emitter electrode 7b and flows rectilinearly immediately below the $n^+$-type emitter layer 5b, and it can be appreciated that the $n^+$-type emitter layer 5b operates substantially as the cathode of the thyristor. In contrast, in the transistor state shown in FIG. 4(b), in the same way as the IGBT, the main current of the device flows from the $n^-$-type base layer 3 to the emitter electrode 7a via the first MOSFET 12, while the hole current enters the p-type base layer 4 from the first MOSFET 12 side, passes through the second MOSFET 13 via the short-circuiting electrode 8 and the $n^+$-type drain layer 6, and flows out to the emitter electrode 7b, where the actual electron current or electron flow is in the reverse direction, as indicated in the drawing. This state is shown in FIGS. 5(a) and 5(b). As shown in the drawings, the main current in the transistor state does not flow through the region located below the $n^+$-type emitter layer 5b which is the main-current path in the thyristor state. Hence, it can be seen that, in this device, the main current path in the thyristor state and the main current path in the transistor state are separated.

Figure 6A:
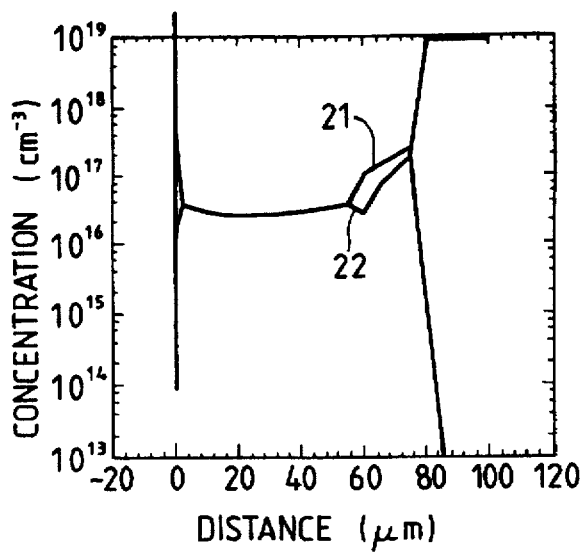
FIG. 6(a) is a graph illustrating the state of the carrier concentration in the thyristor state of the semiconductor device of the first embodiment.
Figure 6B:
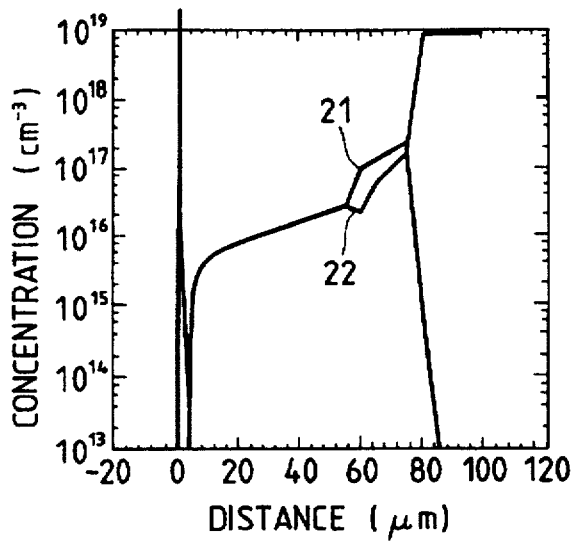
FIG. 6(b) is a graph illustrating the state of the carrier concentration in the transistor state of the semiconductor device of the first embodiment.

FIGS. 6(a) and 6(b) shows the carrier concentration in the thyristor state and the transistor state. This drawings show the result of simulation of the concentration of holes and electrons from the obverse surface side of the device with the emitter electrodes 7a and 7b disposed thereon to the reverse surface side thereof with the collector electrode 1 disposed thereon. Solid lines 21 indicate the concentration of holes, and solid lines 22 indicate the concentration of electrons. In addition, the ordinate of this graph shows the carrier concentration of holes or electrons, while the abscissa shows the distance from the surface of the semiconductor device. First, FIG. 6(a) shows the carrier concentration in the thyristor state, in which the concentrations of both carriers extending from the obverse surface of the device toward the p-type base layer 4 and the n⁻-type base layer 3 show large values in a range of $10^{16}$–$10^{17}$/cm³. It should be noted that, in the p⁺-type collector layer 2 which is on the reverse surface of the device, the concentration of holes, which are majority carriers, increases, while the concentration of electrons decreases. In contrast, in the transistor state shown in FIG. 6(b), it can be seen that the carrier concentration decreases down to about $10^{14}$ in the vicinity of a boundary between the p-type base layer 4 and the n⁻-type base layer 3. Thus, as a shift takes place from the thyristor state to the transistor state, the carrier concentration in the device decreases, so that the turn-off time can be reduced. Accordingly, the turn-off time of this device can be reduced like the IGBT.

Figure 7:
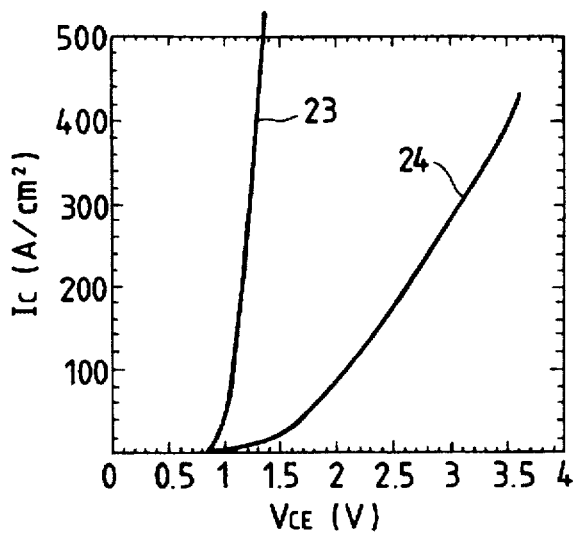
FIG. 7 is a graph illustrating the on-state voltage drop of the semiconductor device of the first embodiment.

Next, FIG. 7 shows the result of simulation of the on-state voltage drop in this device. It should be noted that, in FIG. 7, solid line 23 indicates the on-state voltage drop in the thyristor state, while solid line 24 indicates the on-state voltage drop in the transistor state. If it is assumed that a collector-emitter voltage $V_{CE}$ at which a collector current Ic reaches 100 A/cm² is an on-state voltage drop Von, Von in the thyristor state is about 1.1 V, and Von in the transistor state is about 2.3 V. Thus, by setting the device in the thyristor state when the device is turned on, it becomes possible to control the on-state voltage drop to a low level.

Figure 8A:
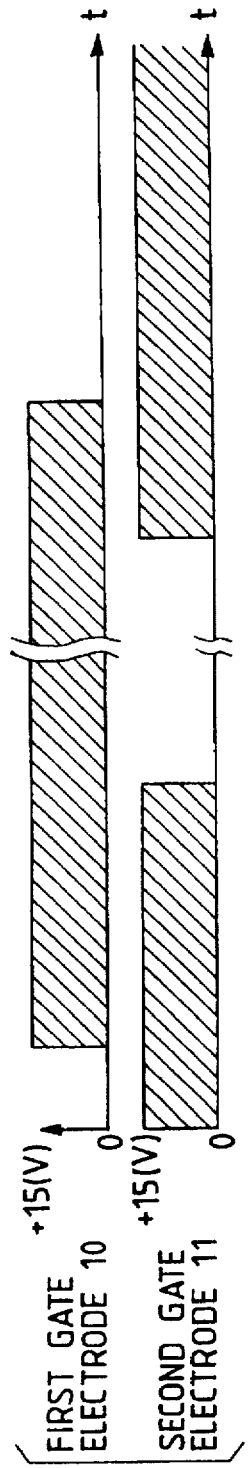
FIG. 8 is a graph illustrating the switching characteristics of the semiconductor device of the first embodiment.
Figure 8B:
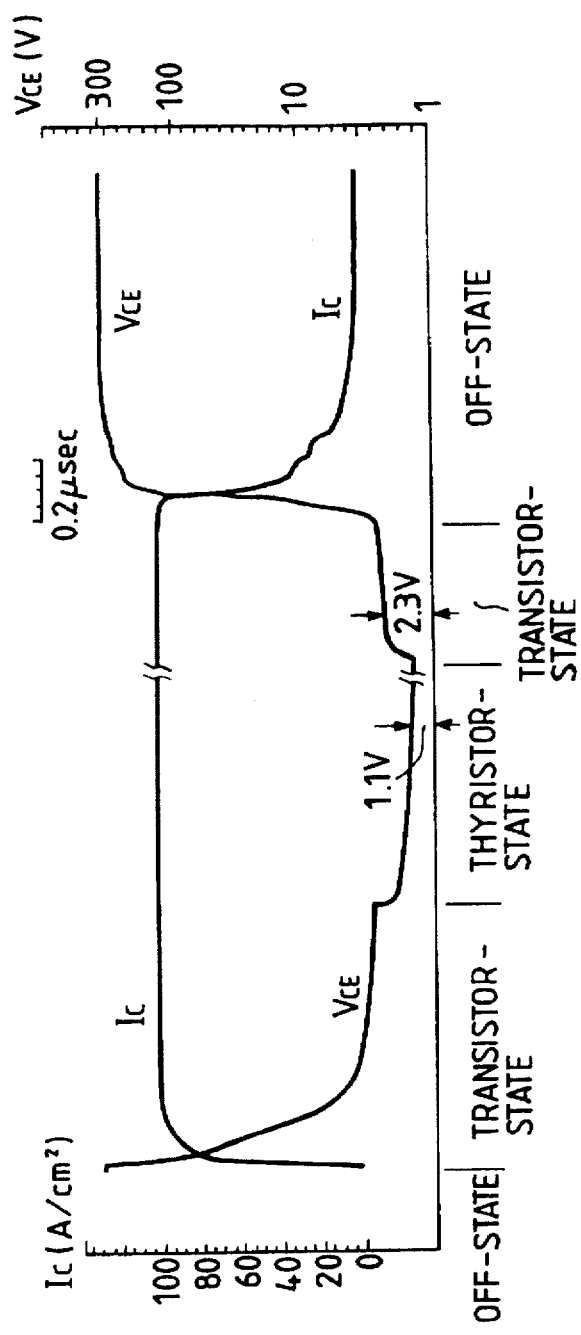

FIG. 8 shows in a summarized form the gate voltage applied to the first and second gate electrodes 10 and 11 during the on and off operations of this device, as well as the manner of change of the collector current Ic and the collector-emitter voltage $V_{CE}$ of this device. The operation of this device in each operation has been described above in detail and will be omitted, but by applying high potential to the first gate electrode 10, the device is set in the thyristor state at a high speed of a 0.3-µ second level in terms of the turn-on time, and shows a low on-state voltage drop. Then, as the second gate electrode 11 is set under high potential, the device undergoes a change from the thyristor state to the transistor state, and that change is completed within 0.5µ second. Subsequently, it is possible to turn off the device with a short fall time of about 0.3µ second.

Thus, the device of this embodiment is a device arranged to be capable of selecting the operating state of the device by means of two gate electrodes 10 and 11, and a reduction of the on-state voltage drop due to the thyristor state and high-speed switching due to the transistor state are realized simultaneously. Moreover, in this device, a structure is adopted in which the main current in the thyristor state and the main current in the transistor state are allowed to flow through separate paths. Namely, the first characteristic of this embodiment lies in that the first emitter layer 5a, serving as the source in the first MOSFET 12 for injecting electrons, i.e., majority carriers, for turning on the thyristor, and the second emitter layer 5b, serving as a virtual cathode through which the main current flows during the thyristor operation, are spaced apart and separated from each other. Since the impurity concentration in the region below the first emitter layer 5a and the impurity concentration in the region below the second emitter layer 5b become independently controllable, it goes without saying that the thyristor operation can be achieved with a low on-state voltage drop, and that a reduction in the turn-off time can be accomplished. In addition, the latch-up withstand capability can be increased.

Figure 38A:
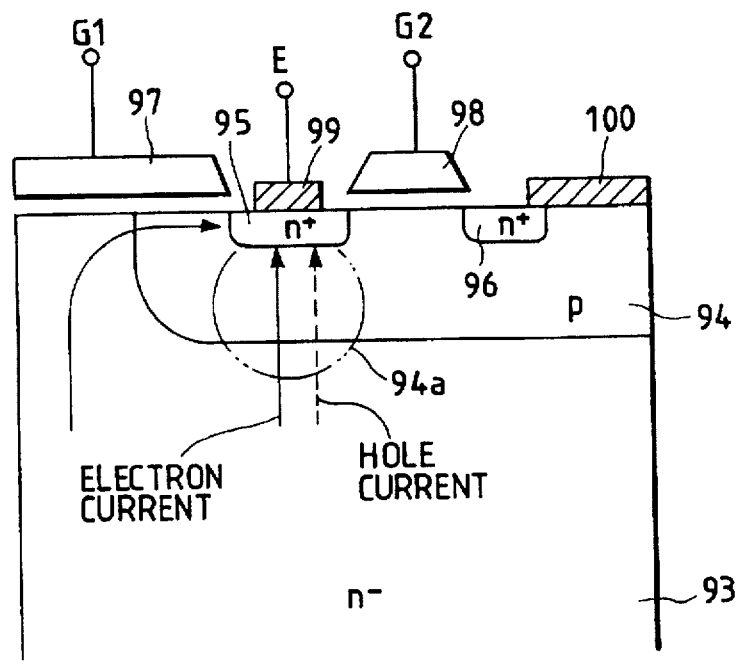
FIG. 38(a) is a cross-sectional view illustrating the flow of electron current and hole current in the thyristor state of the semiconductor device shown in FIG. 36.
Figure 38B:
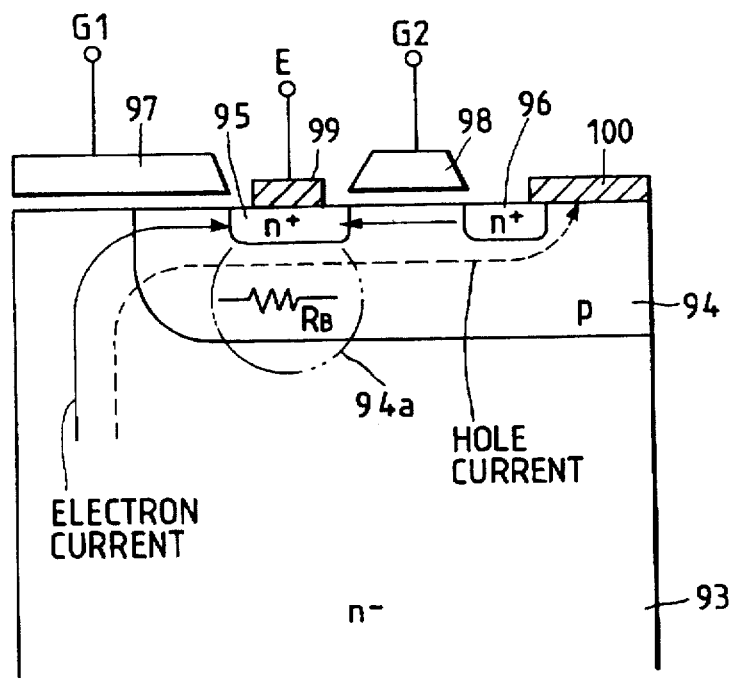
FIG. 38(b) is a cross-sectional view illustrating the flow of electron current and hole current in the transistor state of that semiconductor device shown in FIG. 36.

Here, the longer the spaced-apart distance between the first emitter layer 5a and the second emitter layer 5b, an overlapping portion of the current path during the thyristor state and of the current path during the transistor state is unlikely to occur; however, the degree of integration becomes deteriorated. In addition, even if the impurity concentration in the current path during the transistor state can be independently controlled higher than the impurity concentration in the current path during the thyristor state, since the current path during the transistor state becomes long, this becomes a factor increasing the path resistance (base resistance). Accordingly, the second characteristic of this embodiment lies in that, in order to reduce the length of the current path (hole current path) during the transistor state in the base layer 4, the drain layer 6 of the second MOSFET 13 for drawing out holes is disposed between the first emitter layer 5a and the second emitter layer 5b. During the transistor operation, as shown in FIG. 5(b), the hole current flowing from the first MOSFET 12 into the p-type base layer 3 passes through the lower side of the first emitter layer 5a and is drawn into its adjacent shortcircuiting electrode 8. In the conventional structure shown in FIG. 38(b), after the hole current passes through the region below the drain layer 96 from the region 94a below the emitter layer 95 and is introduced into the shortcircuiting electrode 100, a current path is formed in which the current returns to the emitter layer 95 via that second MOS portion. Hence, the amount of overlap of the current path is large, and the resistance value of path resistance is thereby increased. However, since in this embodiment there is no overlap in the current path, the current path of this embodiment is shortened as compared with the path length of the conventional structure despite the fact that the second emitter layer 5b is added. For this reason, it is possible to increase the latch-up current (controllable current) during the transistor state owing to a decrease in the path resistance (base resistance). In other words, it can be said that the path length of the hole current path during the transistor state can be shortened by providing the second emitter layer 5b separately and spaced apart from the first emitter layer 5a. It should be noted that the first emitter layer 5a of this embodiment virtually functions as the source region of the electron-injecting MOSFET 12 when the thyristor is turned on, while the second emitter layer 5b functions as the source region of the hole drawing-out MOSFET 13 during the transistor state together with the cathode region of the main current during the thyristor operation.

Figure 9:
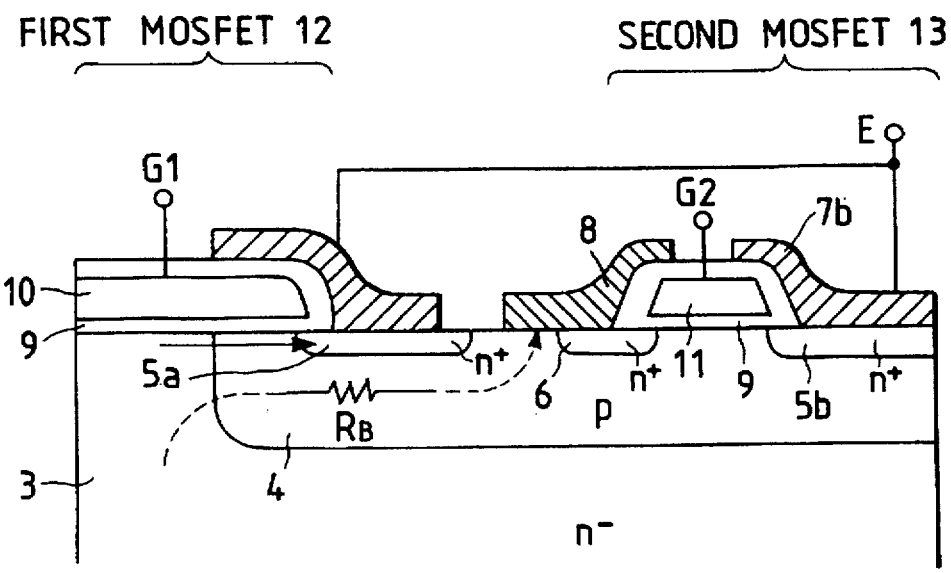
FIG. 9 is a cross-sectional view illustrating the state in which base resistance is parasitic in that semiconductor device of the first embodiment.
Figure 10:
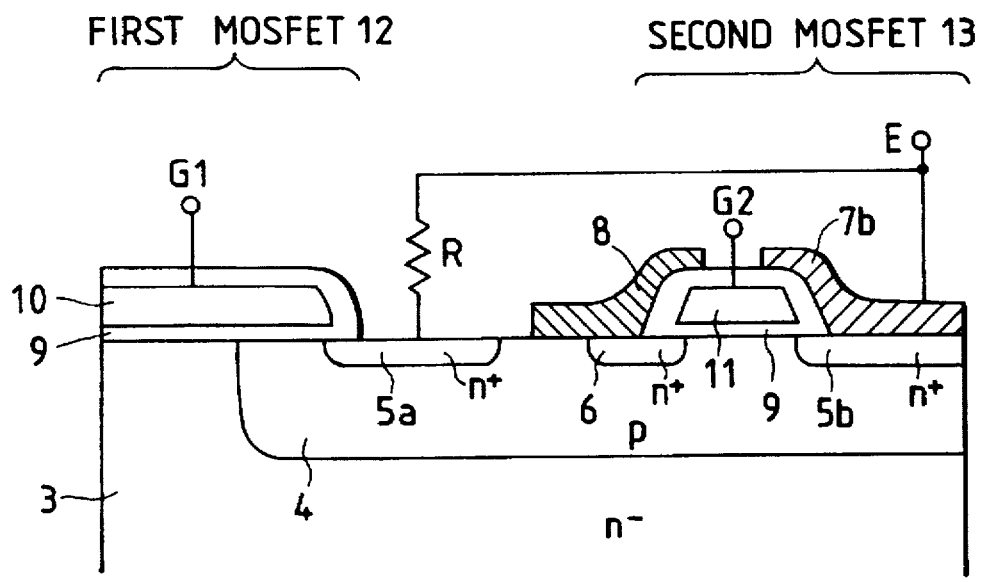
FIG. 10 is a cross-sectional view illustrating a state in which the emitter resistance of a first emitter layer is added in that semiconductor device of the first embodiment.

As described above, by providing the emitter layer 5a and the emitter layer 5b in mutually spaced-apart relation, it is possible to separate the current path during the thyristor operation and the current path during the transistor operation from each other. Therefore, it is possible to independently control the impurity concentration in the p-type region below the emitter layer 5a, as will be described later, and it is possible to increase the current value (controllable current value) until a latch-up during the transistor operation. Here, however, a measure for increasing the current value for a latch-up, apart from the impurity concentration in the p-type base 4, will be considered. During the transistor operation, as shown in FIG. 9, the hole current (shown by the broken line) flows from the lower side of the MOSFET 12 to the p base layer 4, and flows into the shortcircuiting electrode 8 via the lower side of the first emitter layer 5a. When the voltage drop of the base resistance $R_B$ becomes large due to the overcurrent of this hole current, the p base layer 4 is forwardly biased with respect to the emitter layer 5a, and a built-in potential (approx. 0.7 V) between the p base layer 4 and the n-type first emitter layer 5a is exceeded. Thus, the npn transistor constituted by the first n-type emitter layer 5a, the p base layer 4, and the n-type base layer 3 is turned on, resulting in a latch-up. Of course, if the on-resistance of the MOSFET 13 is taken into consideration, there is a possibility of occurrence of a latch-up even when the voltage drop of the base resistance $R_B$ is a value below the built-in potential voltage. Accordingly, as a measure different from the method of controlling the impurity concentration in the p-type base layer 4, as shown in FIG. 10, a structure is adopted in which an emitter resistance R is connected to the first emitter layer 5a to increase the potential at the first emitter layer 5a. As a result, even if an overcurrent flows in the p base layer 4, and the potential at the p base layer 4 increases for the voltage drop due to the base resistance $R_B$, a voltage drop occurs in the emitter resistance R owing to the electron current via the MOSFET 12, and the potential at the emitter layer 5a increases. Hence, it becomes difficult for the p base layer 4 and the emitter layer 5a to become forwardly biased.

Here, if the resistance value of the emitter resistance R is large, it would be possible to increase the current value for a latch-up during the transistor operation. However, if the resistance value is too large, an increase in the on-state voltage drop will result during both the thyristor operation and the transistor operation. Therefore, the resistance value of the emitter resistance R is determined as an example. For instance, if the device of this embodiment has a rated current of 100 A/cm², the proportion of the electron current via the MOSFET 12 is approximately 70%, a current of 70 A/cm² flows across the first emitter layer 5a in the transistor state. If the current value for a latch-up in this device is assumed to be 1000 A/cm², the electron current of approximately 700 A/cm² flows across the first emitter layer 5a at that time. At this time, if the emitter resistance R of about 1 m ohm is connected, the potential at the first emitter layer 5a becomes approximately +0.7 V. Accordingly, it can be seen that it is sufficient to set the value of the emitter resistance R at about 1 m ohm. On the other hand, with the resistance value of this magnitude, the portion of an increase in the on-state voltage drop at the rated current of 100 A/cm² is about 1 m ohm×70 A/cm²=0.07 V, and the increase in the loss is very small. Thus, it can be said that the effect due to the emitter resistance R does not occur at all under the normal condition of use.

Figure 11:
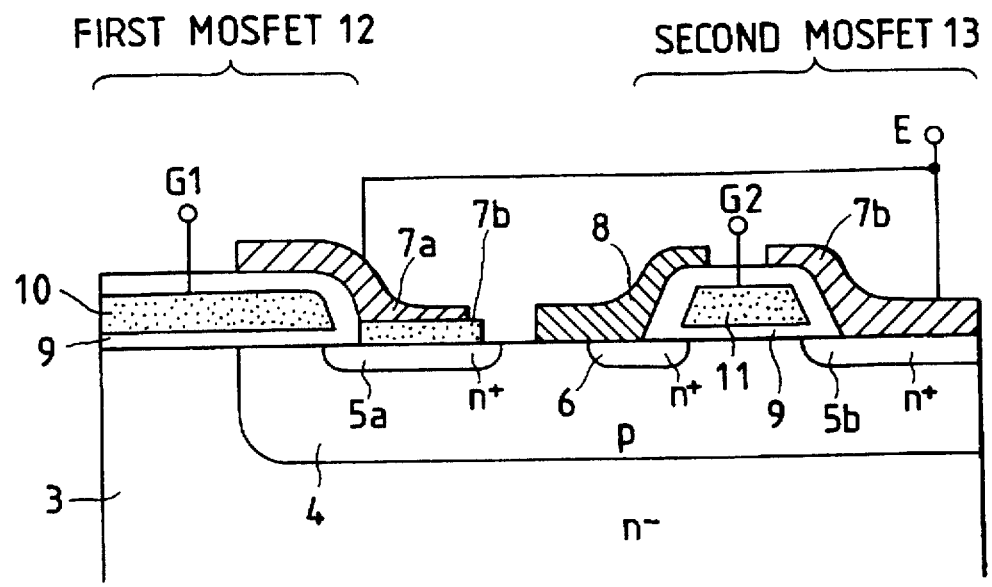
FIG. 11 is a cross-sectional view illustrating a state in which a high-resistance polycrystalline silicon layer is formed as the emitter resistance of the first emitter layer in that semiconductor device of the first embodiment.

Now, a specific structure for providing the emitter resistance R in this embodiment will be described. First, as shown in FIG. 11, the emitter electrode 7a is provided on the first emitter layer 5a via the high-resistance polycrystalline silicon layer 7b serving as the emitter resistance R. In the formation of this high-resistance polycrystalline silicon layer 7b, the process for forming the polycrystalline-silicon-layer gate electrodes 10 and 11 may be used.

Figure 12:
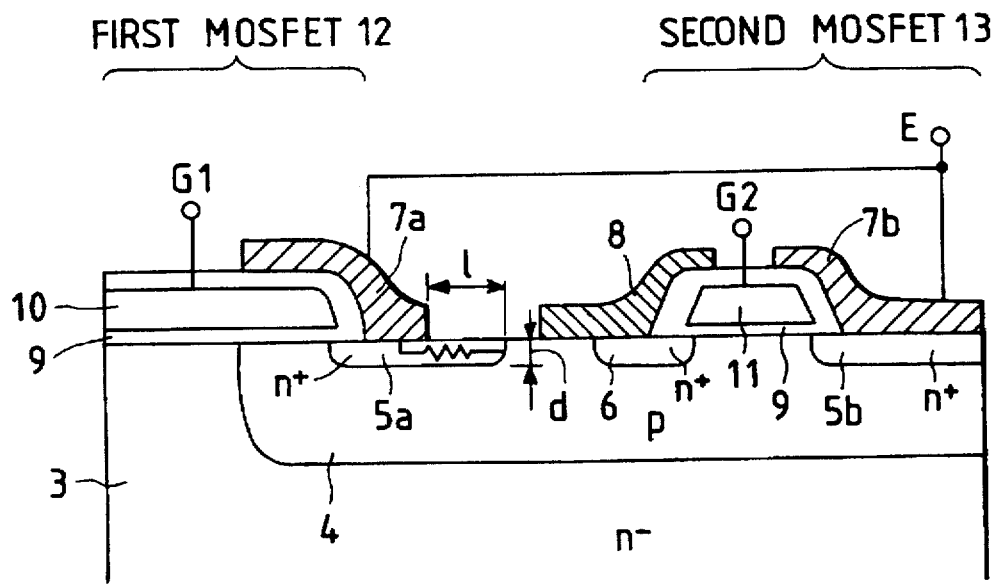
FIG. 12 is a cross-sectional view illustrating a state in which the diffusion resistance of the emitter layer is used as the emitter resistance of the first emitter layer in that semiconductor device of the first embodiment.

Thus, the high-resistance polycrystalline silicon layer 7b is not laminated on the emitter layer 5a, but the diffusion resistance of the first emitter layer 5a itself can be used as the emitter resistance R. If the impurity concentration in the first emitter layer 5a is lowered, it is possible to increase the sheet resistance, and if the diffusion depth of the first emitter layer 5a is made shallow, the diffusion resistance value can be increased. Here, such a specific resistance ρ and diffusion depth d of the first emitter layer 5a that the resistance value of the emitter resistance R becomes 1 m ohm, will be considered. It was found that in the aforementioned case of the rated current of 100 A/cm², 700 A/cm² of latch-up current flows across the emitter layer 5a. If it is now assumed that, in the chip layout of the device of this embodiment, the emitter layers 5a are juxtaposed at a pitch of 40 μm in the form of stripes, then 250 emitter layers 5a would be juxtaposed in an planar area of 1 cm². Accordingly, if the length L of the diffusion resistance of the emitter layer is assumed to be $10^{-4}$ cm, as shown in FIG. 12, the following formula holds:

$$R=(L\times\rho)/(d\times1\times250)=10^{-4}\,\rho/250d=1\text{ m ohm} \qquad 1$$

Accordingly, the following formula can be derived:

$$2500d=\rho \qquad 2$$

As for the diffusion depth d, if an actual process is taken into consideration, about 0.1 μm is a lower limit. If this value is adopted, the specific resistance ρ is 0.025 ohm cm, and this corresponds to a surface concentration of $1\times10^{18}$ cm$^{-3}$. Accordingly, if it is assumed that the diffusion depth d is 0.1 μm or more, $1\times10^{18}$ cm$^{-3}$ to $1\times10^{19}$ cm$^{-3}$ is appropriate as the surface concentration. Thus, by decreasing the impurity concentration in the first emitter layer 5a, or by making the diffusion depth thereof shallow, it is possible to increase the diffusion resistance value of the first emitter layer 5a. Hence, it is possible to increase the current value for a latch-up, and a large latch-up withstand capability can be obtained.

Figure 13:
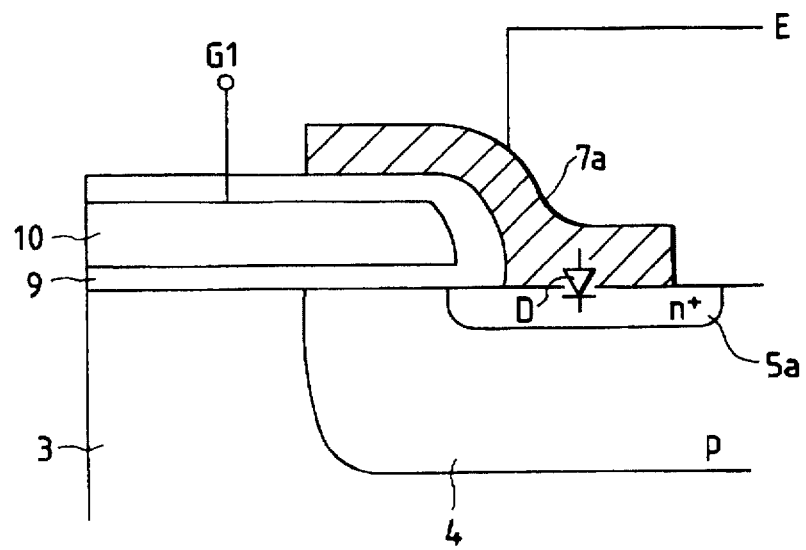
FIG. 13 is a cross-sectional view illustrating a state in which a Schottky contact is formed by the first emitter layer and an emitter electrode in that semiconductor device of the first embodiment.

FIG. 13 shows an example for increasing the potential at the first emitter layer 5a by using another measure. Here, a state is shown in which a Schottky contact D is formed at an interface between the first emitter layer 5a and the emitter electrode 7a formed of aluminum. This Schottky contact D can be obtained by combining the work functions of the metal and the semiconductor. When current flows across the first emitter layer 5a, the potential at the first emitter layer 5a is biased by a fixed amount, so that the current value for a latch-up can be increased. It should be noted that, as an alternative measure, emitter resistance can be obtained by means of contact resistance.

Next, the structure of the second MOSFET 13 in this embodiment will be described. The second MOSFET 13 shown in FIG. 1 is formed by self-alignment by using the polycrystalline silicon gate electrode 11, in the same way as the first MOSFET 12.

Figure 14:
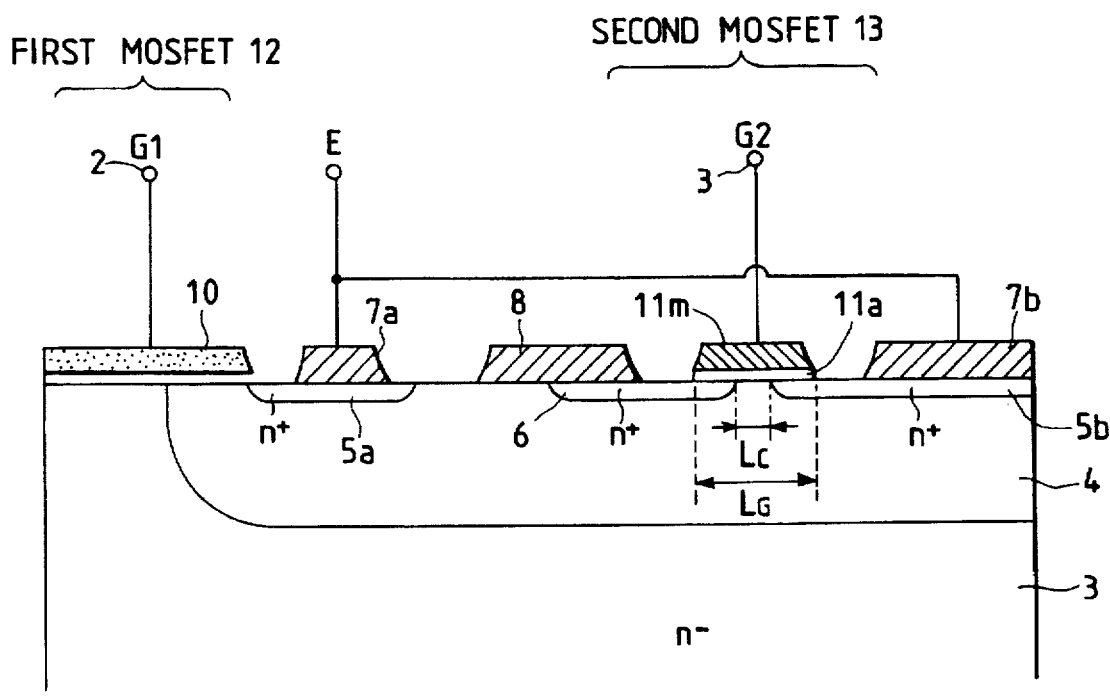
FIG. 14 is a cross-sectional view illustrating a state in which the gate electrode of the second MISFET is formed as a metal gate in that semiconductor device of the first embodiment.
Figure 15A:
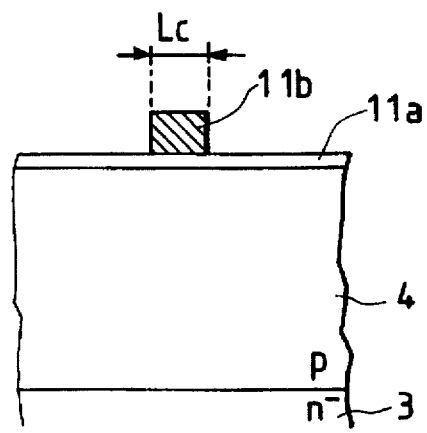
FIGS. 15(a) to 15(c) are cross-sectional views illustrating a process for forming the metal gate shown in FIG. 14.
Figure 15B:
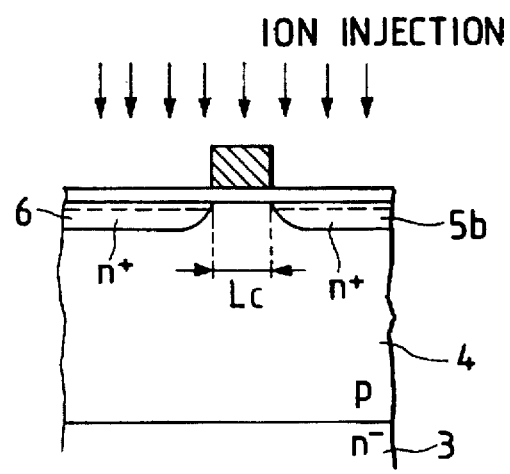
Figure 15C:
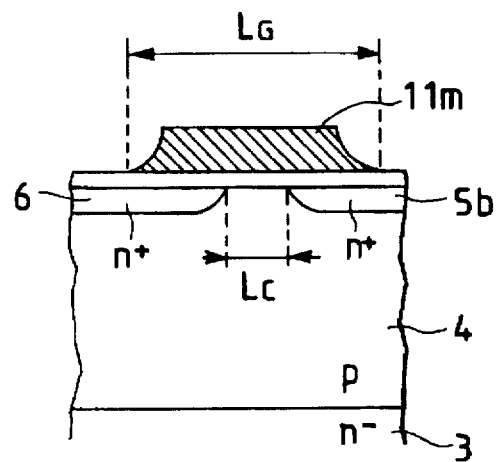

Through this self-alignment, the drain layer 6 and the emitter layer (source layer) 5b are formed by using the gate electrode 11 as a mask, and the channel length is determined by the gate length of the polycrystalline silicon gate electrode 11. The channel length of this second MOS 13 is preferably a short channel. The reason for this is that a reduction in the on-resistance in the second MOSFET 13 makes it possible to accelerate the drawing of holes from the p base 4 and to increase the turn-off speed. However, in the case where the second MOSFET 13 is formed through self-alignment using the polycrystalline silicon gate, the realistic length of the gate electrode 11 is practically approximately 1 μm even in a microprocessing process, so that it is difficult to set the gate length of a submicron order with high accuracy. Therefore, in this embodiment, as shown in FIG. 14, this second MOSFET 13 is formed by a metal gate 11m of a short gate length. If this process of forming the metal gate 11m is used for the portion of the second MOSFET 13, the gate length $L_G$ and the channel length $L_C$ can be respectively controlled independently. As for the method of forming the second MOSFET 13 of this metal gate, as shown in FIG. 15(a), a resist mask 11b of a length approximately equivalent to the channel length $L_C$ is first formed on the main surface of the p base 4 via a gate insulating film ($SiO_2$). Then, as shown in FIG. 15(b), ion implantation is provided from a position above the resist mask 11b, thereby forming the drain layer 6 and the emitter layer (source layer) 5b. Subsequently, after removing the resist mask 11b, as shown in FIG. 15(c), a metal (e.g. aluminum) layer is formed, and this layer is subjected to patterning to form a metal gate electrode 11m of a gate length $L_G$ longer than the channel length $L_C$. Since a short-channel MOSFET 13 can be obtained by such a metal gate, the turn-off time can be shortened through the reduction of the on-resistance. In addition, there is an advantage in that the wiring resistance can be reduced as compared with a polycrystalline silicon gate.

Next, a chip layout and a cell pattern of the device of this embodiment will be described.

Figure 16:
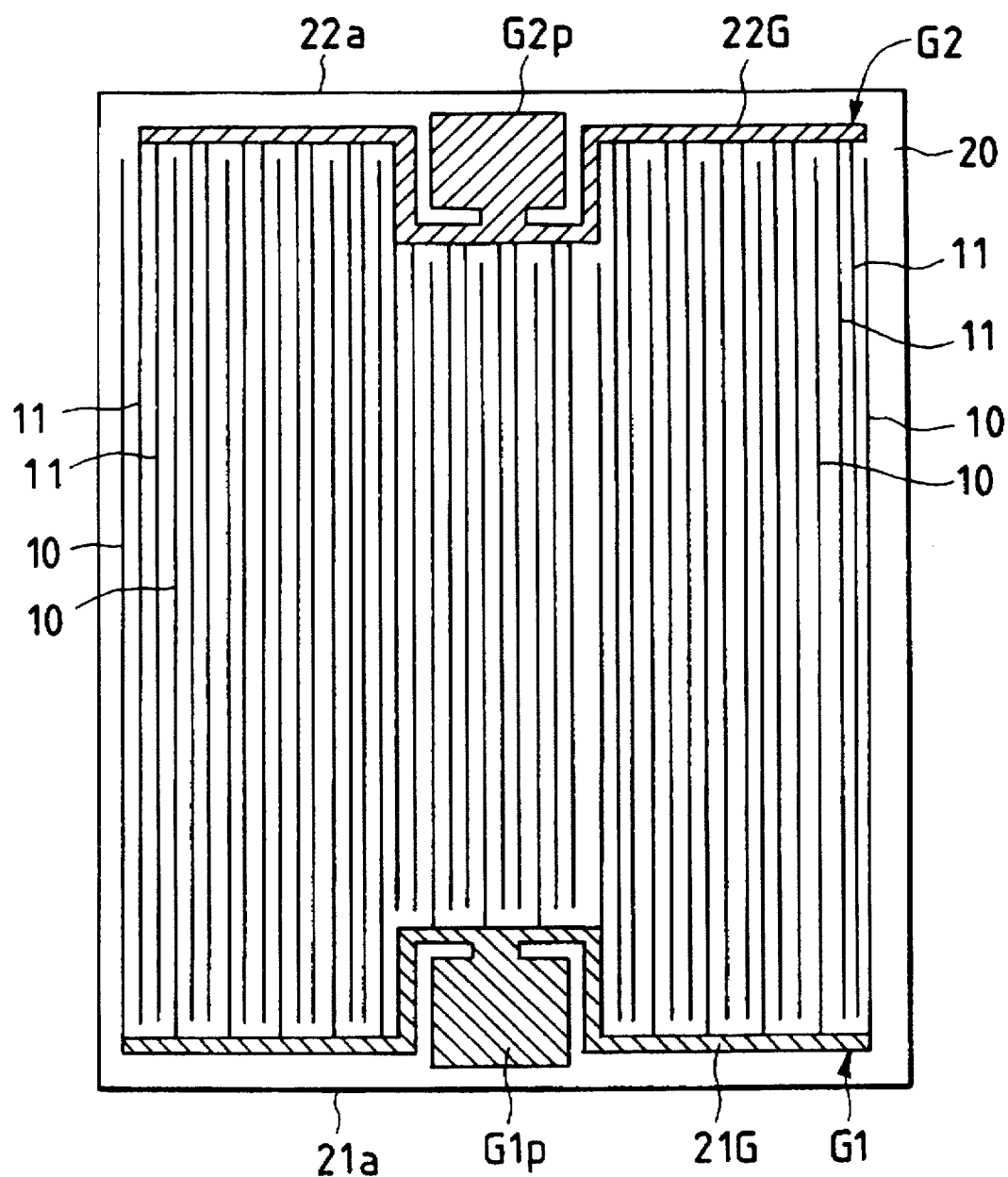
FIG. 16 is a plan view illustrating the chip layout of the semiconductor device of the first embodiment.

As shown in FIG. 16, a gate pad $G1_p$ of a first gate electrode G1 is disposed in a substantially central portion on one side 21a of a chip 20 of this device, and a gate pad $G2_p$ of a second gate electrode $G_2$ is disposed in the center on an opposing side 22a thereof.

Figure 17A:
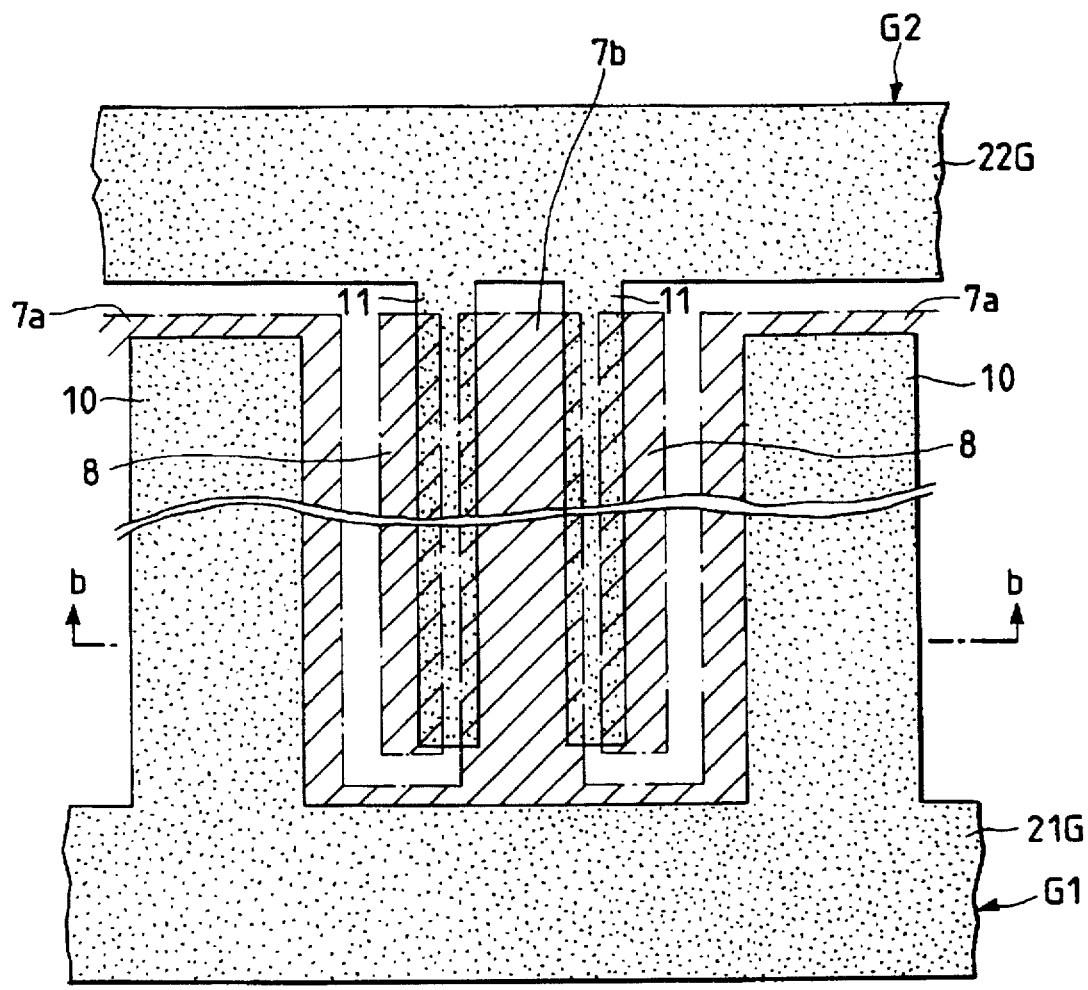
FIG. 17(a) is a plan view illustrating a first cell configuration in that semiconductor device of the first embodiment.
Figure 17B:
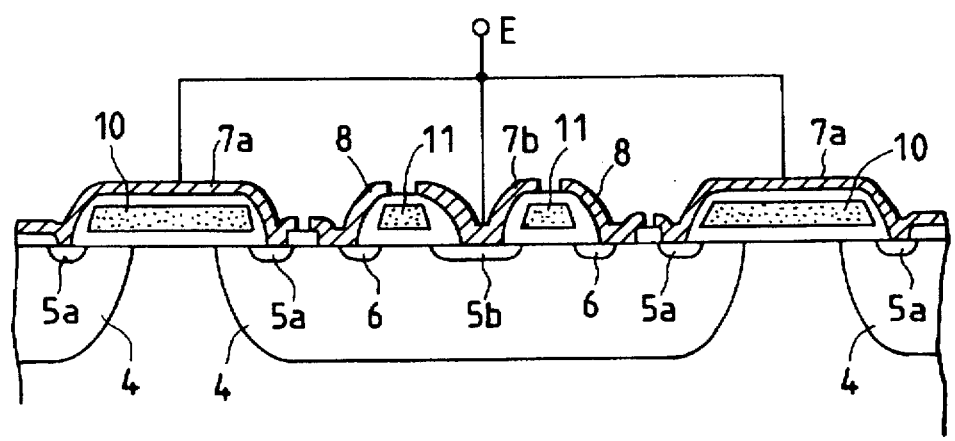
FIG. 17(b) is a cross-sectional view taken in the direction of arrows along line b—b in FIG. 17(a)
Figure 18A:
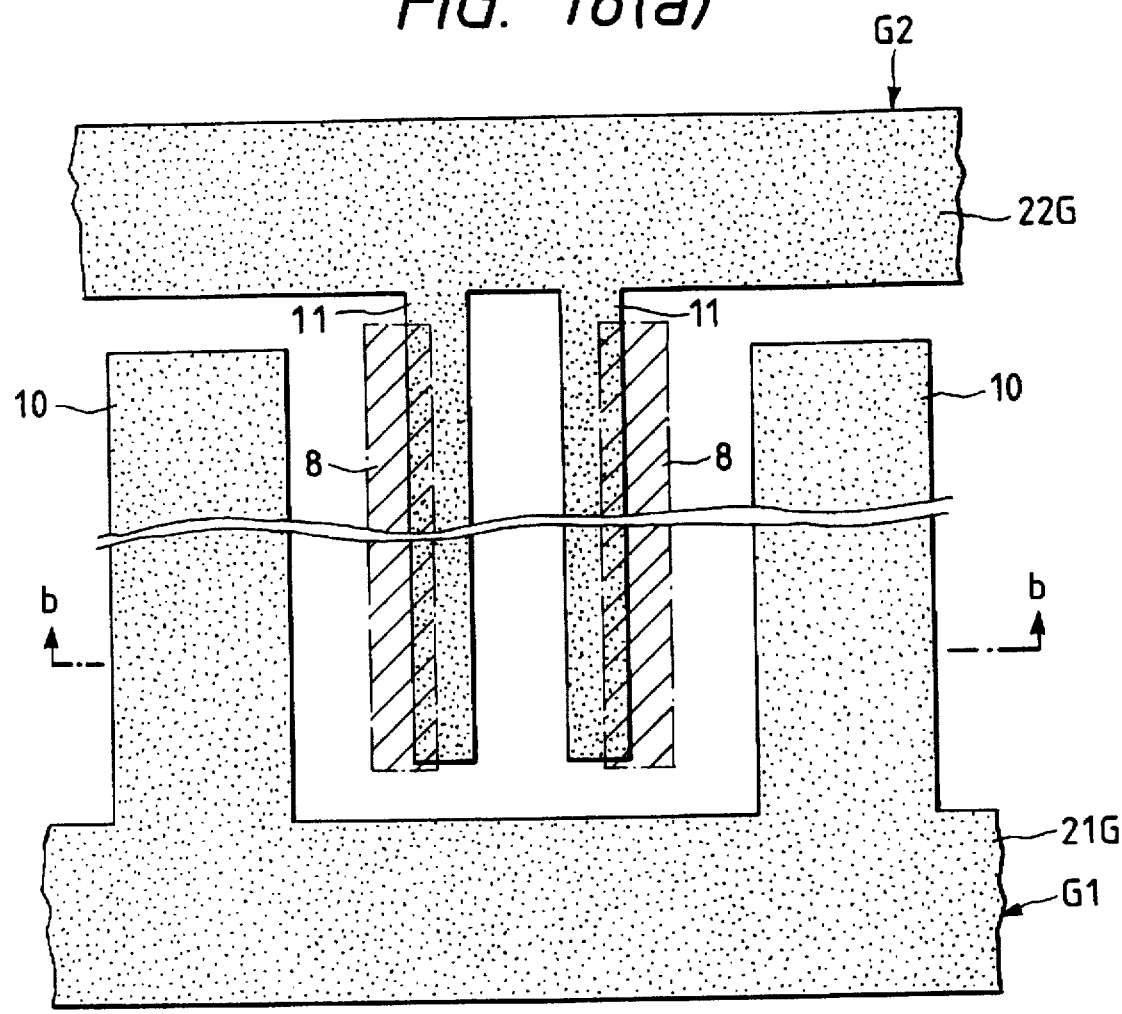
FIG. 18(a) is a plan view illustrating a second cell configuration in that semiconductor device of the first embodiment.
Figure 18B:
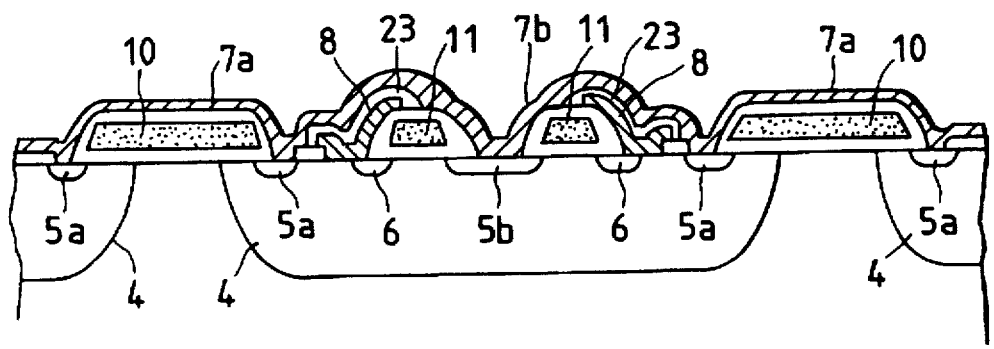
FIG. 18(b) is a cross-sectional view taken in the direction of arrows along line b—b in FIG. 18(a)

Main gate wiring 21G extends from the gate pad $G1_p$ along the side 21a, while main gate wiring 22G similarly extends from the gate pad $G2_p$ along the side 22a. A plurality of gate electrodes 10 branch out from the main gate wiring 21G in the form of comb teeth, while a plurality of gate electrodes 11 similarly branch out from the main gate wiring 22G in the form of comb teeth. Here, two gate electrodes 11, 11 are disposed between two gate electrodes 10, 10. In the chip layout of an arrangement in which the gate electrodes 10 in the form of comb teeth and the gate electrodes 11 in the form of comb teeth are interdigitated, a cell pattern such as the one shown in FIG. 17 is formed. The cell pattern shown in FIG. 17 is formed by wiring of a single layer of aluminum. The shortcircuiting electrode 8 and the emitter electrode wiring 7a and 7b are also formed of aluminum wiring of a similar layer, and the emitter electrode wiring 7a and 7b are connected by detouring the shortcircuiting electrode 8, as shown in FIG. 17(a). According to this single-layer aluminum wiring, it is difficult to ensure the accuracy of patterning (etching) for separation between the shortcircuiting electrode 8 and the emitter electrode wiring 7a and 7b on the gate electrode 11, and the consumption of wiring space due to the interconnection of the emitter electrode wiring 7a and 7b becomes a problem. Accordingly, it is possible to adopt a two-layered wiring structure such as the cell pattern shown in FIG. 18. In this cell pattern, the shortcircuiting electrode 8 is a first aluminum layer, and the emitter electrode wiring 7a and 7b of a second aluminum layer is formed thereon via an interlayer insulating film 23. According to such a two-layered structure, although a slight increase in the process is brought about, the accuracy of patterning and the deterioration in the degree of integration do not constitute problems. Since practically no current flows across the shortcircuiting electrode 8, it is possible to use not only aluminum but also a barrier metal as the material of the electrode. Specifically, Ti, W, a silicide thereof, TiN, TiW, or the like may be used, or polycrystalline silicon may be alternatively used.

Figure 19A:
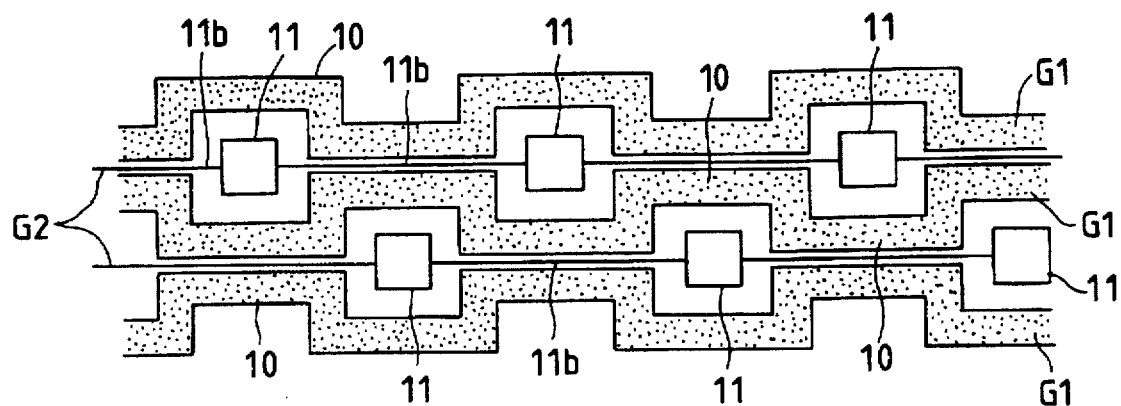
FIG. 19(a) is a plan view illustrating a third cell configuration in that semiconductor device of the first embodiment.
Figure 19B:
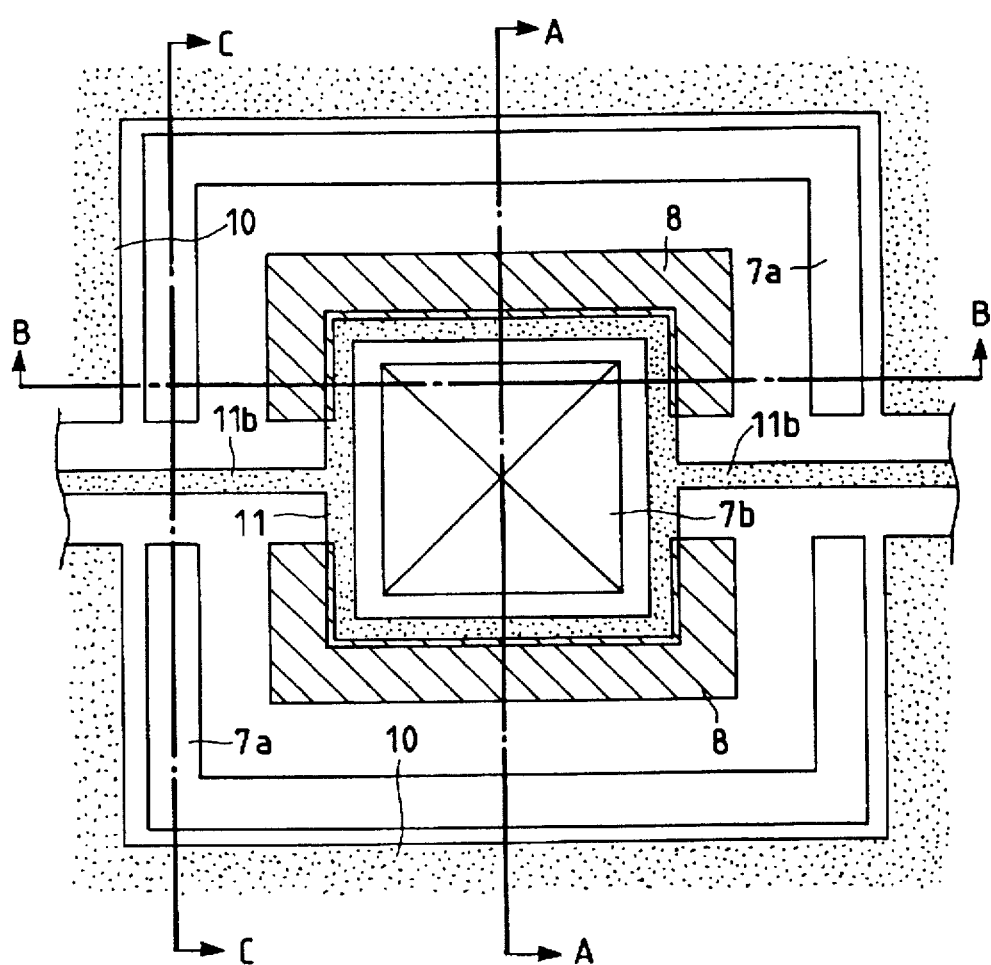
FIG. 19(b) is an enlarged view of FIG. 19(a)
Figure 20A:
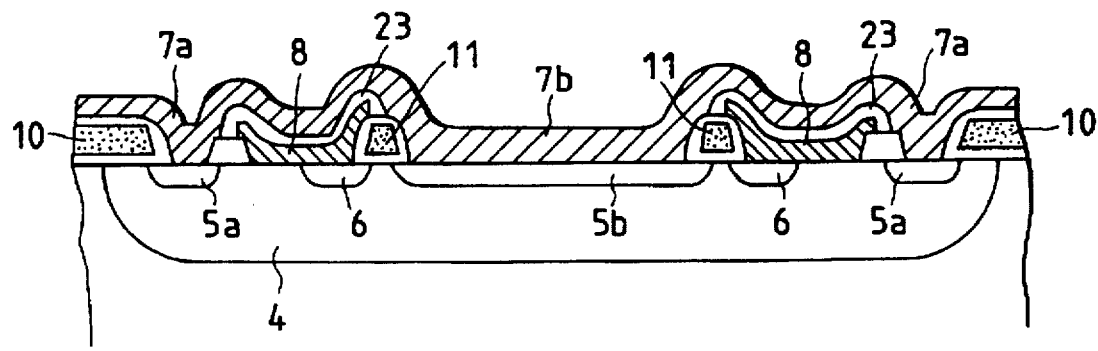
FIG. 20(a) is a cross-sectional view taken in the direction of arrows along line A—A or line B—B in FIG. 19(b)
Figure 20B:
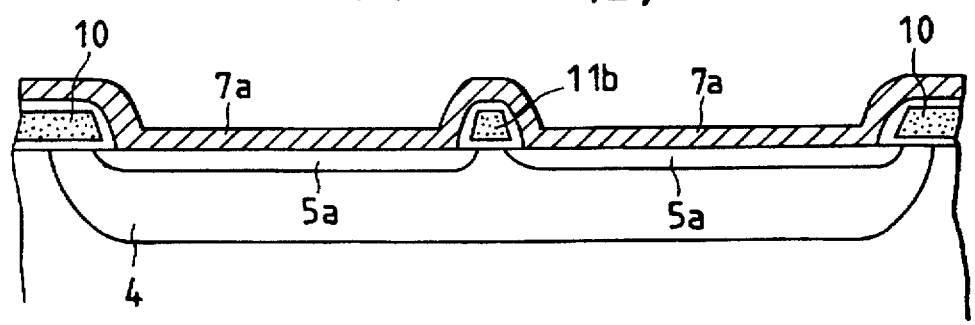
FIG. 20(b) is a cross-sectional view taken in the direction of arrows along line C—C in FIG. 19(b)
Figure 20C:
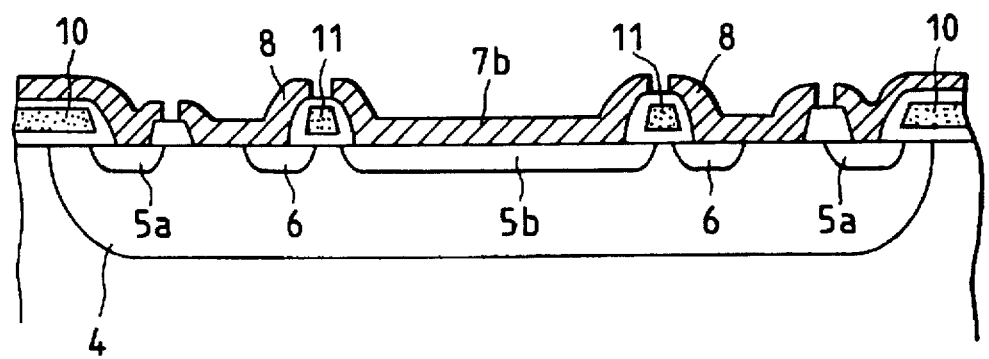
FIG. 20(c) is a cross-sectional view of the state in which the cross-sectional structure shown in FIG. 20(a) is formed by a single-layered wiring structure.

FIG. 19 shows another cell pattern. A branch line branching out from the aforementioned main gate wiring 22G (see FIG. 16) is constituted by an interconnection between a cell-connecting line 11b and the gate electrode 11 of a square ring shape which virtually forms a cell. The gate electrode 10 is formed in such a manner as to surround the outer periphery of the gate electrode 11 of a square ring shape. Then, the emitter electrode 7a which abuts against the second emitter layer is formed on the inner side of this gate electrode 11 of a square ring shape. In this cell pattern, the channel width becomes large by means of the ring-shaped gate electrode 11 of the second MOSFET 13, so that it is possible to lower the on-state voltage drop during the transistor operation. It should be noted although the gate electrode 11 in this cell pattern has a square ring shape, the gate electrode 11 may have the shape of a circular ring, a hexagonal ring, an octagonal ring, or other similar polygonal ring. FIGS. 20(a) and 20(b) show a cross-sectional structure of the device shown in FIG. 19(b). As is apparent from FIG. 20(a), the emitter electrode wiring 7a and 7b of the second layer is formed on the shortcircuiting electrode 8 of the first layer via the interlayer insulating film 23, thereby exhibiting a two-layered wiring structure. In addition, FIG. 20(c) shows a single-layered wiring structure in the cell pattern shown in FIG. 19(b).

Figure 21A:
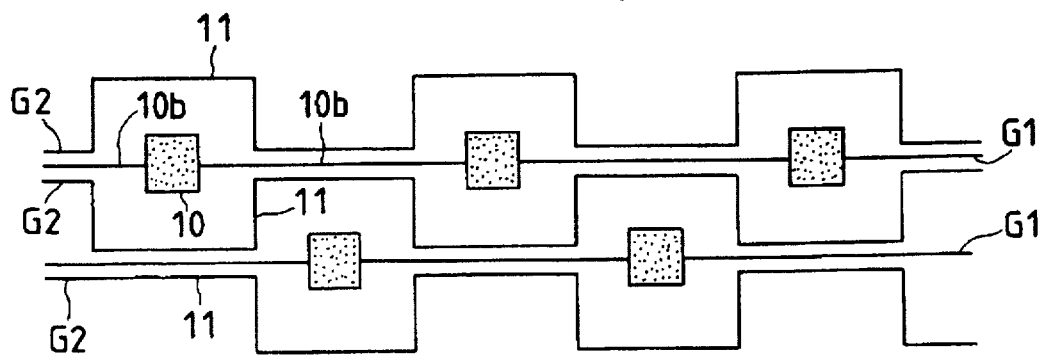
FIG. 21(a) is a plan view illustrating a fourth cell configuration in that semiconductor device of the first embodiment.
Figure 21B:
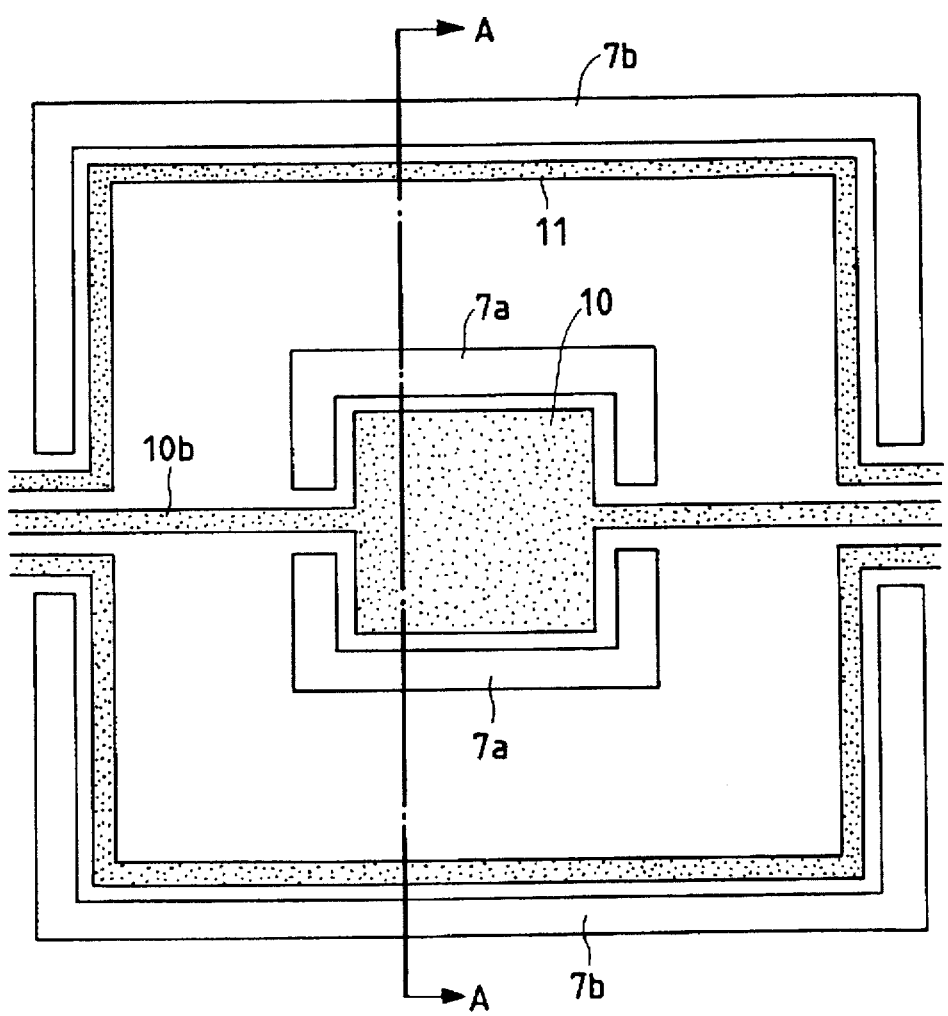
FIG. 21(b) is an enlarged view of FIG. 21(a)
Figure 22:
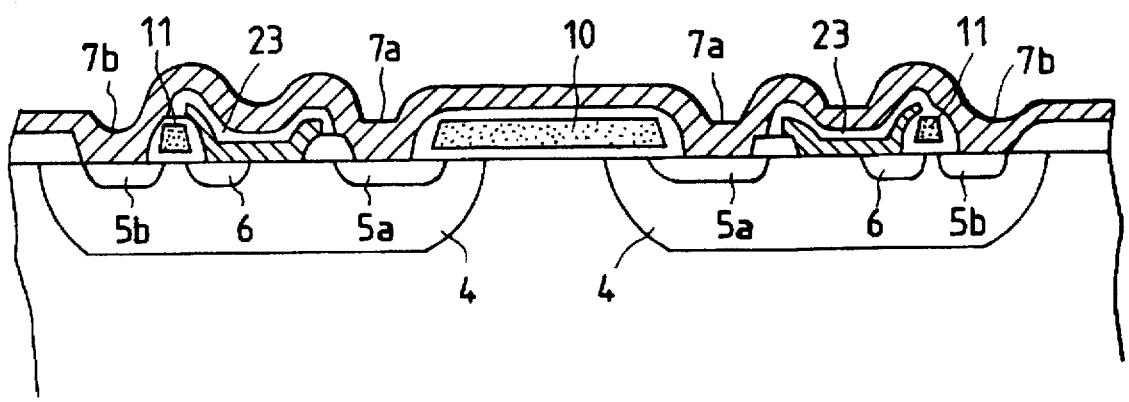
FIG. 22 is a cross-sectional view taken in the direction of arrows along line A—A in FIG. 21(b)

FIG. 21 shows still another cell pattern. In this cell pattern, the gate G1 and the gate G2 are in a relationship in which the inner and outer sides are reversed with respect to the cell pattern shown in FIG. 19. Namely, a branch line branching out from the aforementioned main gate wiring 21G (see FIG. 16) is constituted by the interconnection between a cell-connecting line 10b and the gate electrode 10 of a square ring shape which virtually forms a cell. The gate electrode 11 is formed in such a manner as to surround the outer periphery of the square gate electrode 10. The emitter electrode 7a of the first emitter layer is formed in such a manner as to surround the outer periphery of the gate electrode 10, and the emitter electrode 7b of the second emitter layer is formed in such a manner as to surround the outer periphery of the gate electrode 11. A cross-sectional structure of this cell pattern is shown in FIG. 22. This cross-sectional structure is a two-layered wiring structure. In this cell pattern, the current density becomes gradually smaller since the hole current flowing from the gate electrode 10 into the p-type base layer 4 during the transistor operation flows in a diffusive manner toward the emitter electrode 7b of the second emitter layer while spreading to the outer periphery thereof. Accordingly, since the structure has a low path resistance, the latch-up withstand capability can be increased. It should be noted that although the gate electrode 10 of this embodiment is square, the gate electrode 10 may have a square ring shape in which an outer peripheral portion is left and a central portion is removed, or the gate electrode 10 may have the shape of a circular ring, a hexagonal ring, an octagonal ring, or other similar polygonal ring.

[Second Embodiment]

Figure 23:
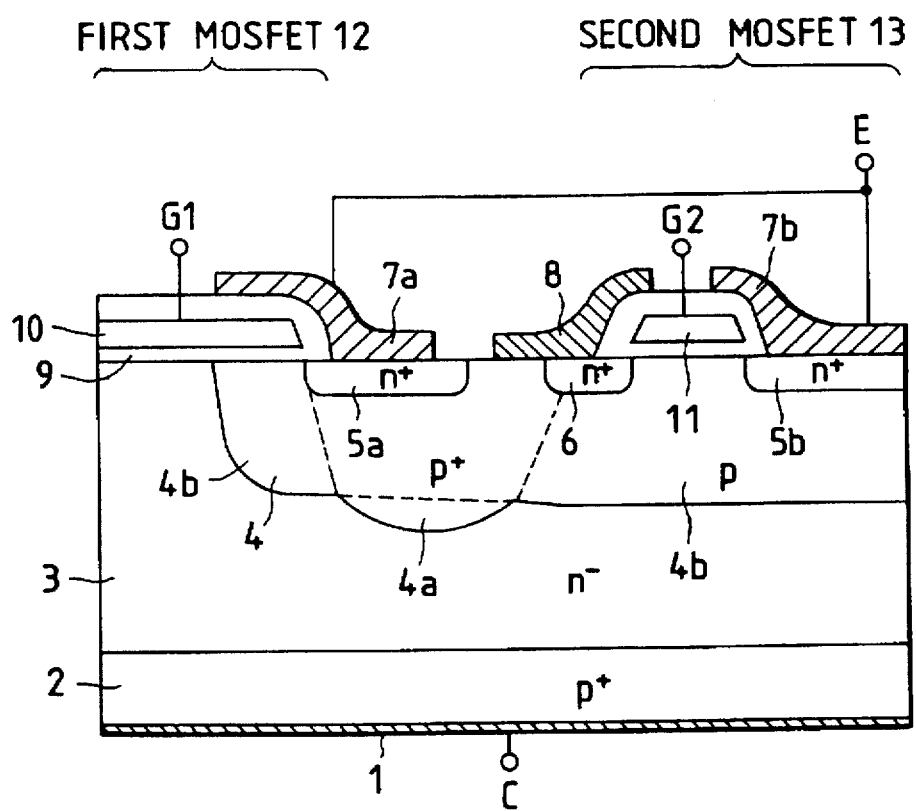
FIG. 23 is a cross-sectional view illustrating a configuration of a semiconductor device in accordance with a second embodiment of the present invention.

FIG. 23 shows a configuration of a semiconductor device having a double-gate structure of a first gate and a second gate in accordance with a second embodiment of the present invention. The arrangement and operation of the semiconductor device in this embodiment are substantially the same as those of the semiconductor device of the first embodiment, and a description of common portions will be omitted by denoting them by the same reference numerals. In the same way as the first embodiment, a $p^+$-type semiconductor substrate with the collector electrode 1 disposed on the rear surface thereof is used as the collector layer 2, and the $n^-$-type base layer 3 is formed thereon. The p-type base layer 4 is formed on the obverse surface of this base layer 3. In the device of this embodiment, the p-type base layer 4 is formed by a high-concentration and slightly-deep diffusion layer ($p^+$ well) 4a and a diffusion layer 4b which is located around the diffusion layer 4a and is slightly shallower than the same. In addition, the n⁺-type emitter layers 5a and 5b and the n⁺-type drain layer 6 are formed on the obverse surface of the p-type base layer 4 on the inner side thereof, in the same way as the first embodiment. Also, the first MOSFET 12 and the second MOSFET 13 are formed.

Figure 24:
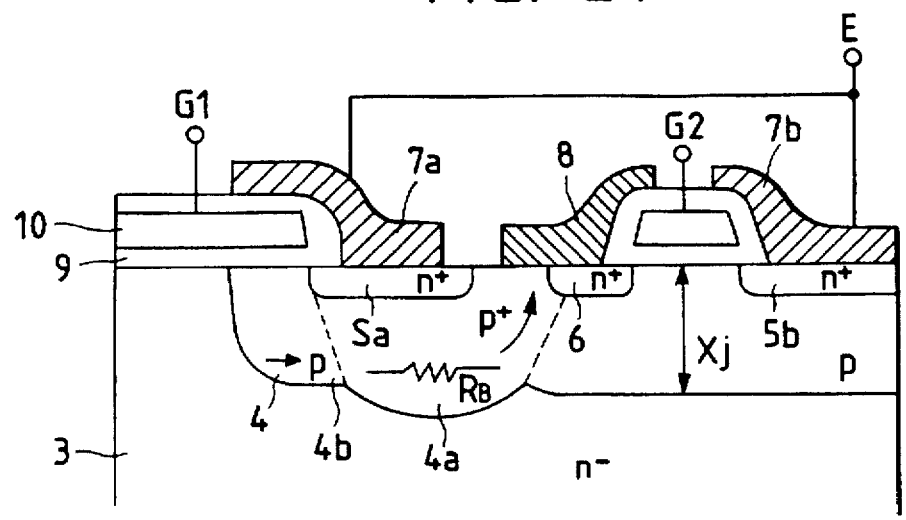
FIG. 24 is a cross-sectional view illustrating a state in which the base resistance is parasitic in that semiconductor device of the second embodiment.

In this device arranged as described above, in the thyristor state, i.e., in a state in which high potential is being applied to the first gate electrode 10 and zero potential is being applied to the second gate electrode 11, if high potential is applied to the second gate electrode 11, this device undergoes a change from the thyristor state to the transistor state in the same manner as the semiconductor device of the first embodiment, and the hole current flows to the emitter electrode 7b via the shortcircuiting electrode 8. Here, as shown in FIG. 24, a major portion of the hole current flows from the n⁻-type base layer 3 to the first MOSFET 12 side, detours the lower side of the n⁺-type emitter layer 5a in the p-type base layer 4, and flows into the shortcircuiting electrode 8. That is, in this device, the lower side of the n⁺-type emitter layer 5a and the lower side of the shortcircuiting electrode 8 in the path in which a major portion of the hole current flows from the n⁻-type base layer 3 to the shortcircuiting electrode 8 are formed as the high-concentration p⁺ well 4a. Hence, it is possible to reduce the resistance in the path of the hole current, and a structure which makes it more difficult for a latch-up to occur is thereby adopted. Here, the path of the main current in the thyristor state of this device is similar to that of the semiconductor device of the first embodiment, and it is located on the lower side of the n⁺-type emitter layer 5b, as shown in FIG. 5(a), and does not come into the highly concentrated region of the device of this second embodiment. Thus, in the device of this embodiment, as compared with the structure shown in FIG. 1 it is possible to increase the amount of controllable current by suppressing the latch-up without increasing the on-state voltage drop in the thyristor state. In addition, since a large hole current is allowed to flow during the transition from the thyristor state to the transistor state, it is possible to reduce the time duration for transition from the thyristor state to the transistor state.

Here, to increase the hole current during the transition from the thyristor state to the transistor state, it is effective to reduce the resistance by doping the p-type base layer 4, i.e., path of the hole current, to a high concentration. Accordingly, it is possible to increase the hole current by increasing to a high degree the concentration in the overall p-type base layer 4 or in a portion of the region where a major portion of the hole current flows. However, increasing the concentration in the overall p-type base layer 4 to a high degree results in an increase in the on-state voltage drop in the thyristor state. In addition, since the on-resistance of the second MOSFET 13 concurrently increases, increasing the concentration in the overall p-type base layer 4 to a high degree substantially impairs the operating characteristics of the device. Therefore, in this device, the region where the high-concentration diffusion layer 4a is formed in the p-type base layer 4 is limited to the lower side of the n⁺-type emitter layer 5a and the lower side of the shortcircuiting electrode 8, and the amount of impurities in a portion immediately below the second gate electrode 11 and in a portion immediately below the n⁺-type emitter layer 5b is such that the on-resistance of the second MOSFET 13 is maintained at a low level. Hence, it is possible to increase the capability to withstand the latch-up without increasing the on-state voltage drop, thereby making it possible to improve the operating characteristics of the device.

Figure 25:
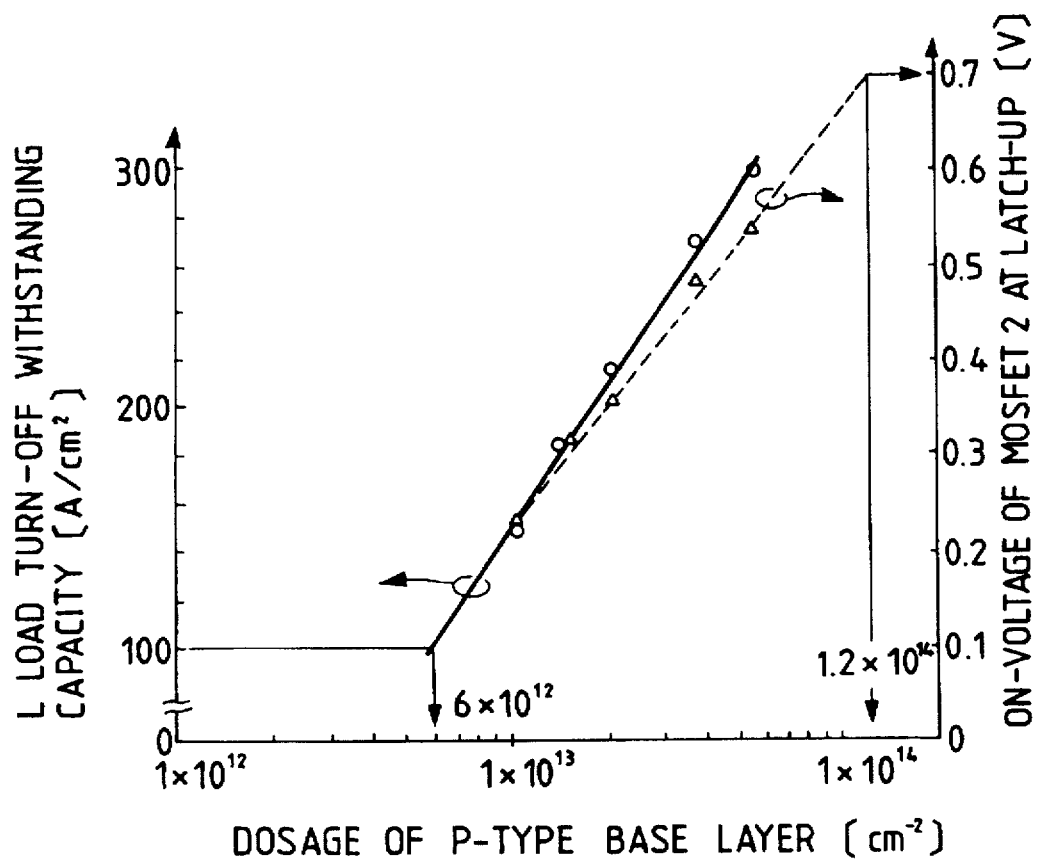
FIG. 25 is a graph illustrating the relationships of an L load turn-off withstand capability and the on-state voltage drop of a second MOSFET during a latch-up with respect to the dosage of the p-type base layer in that semiconductor device of the second embodiment.
Figure 26:
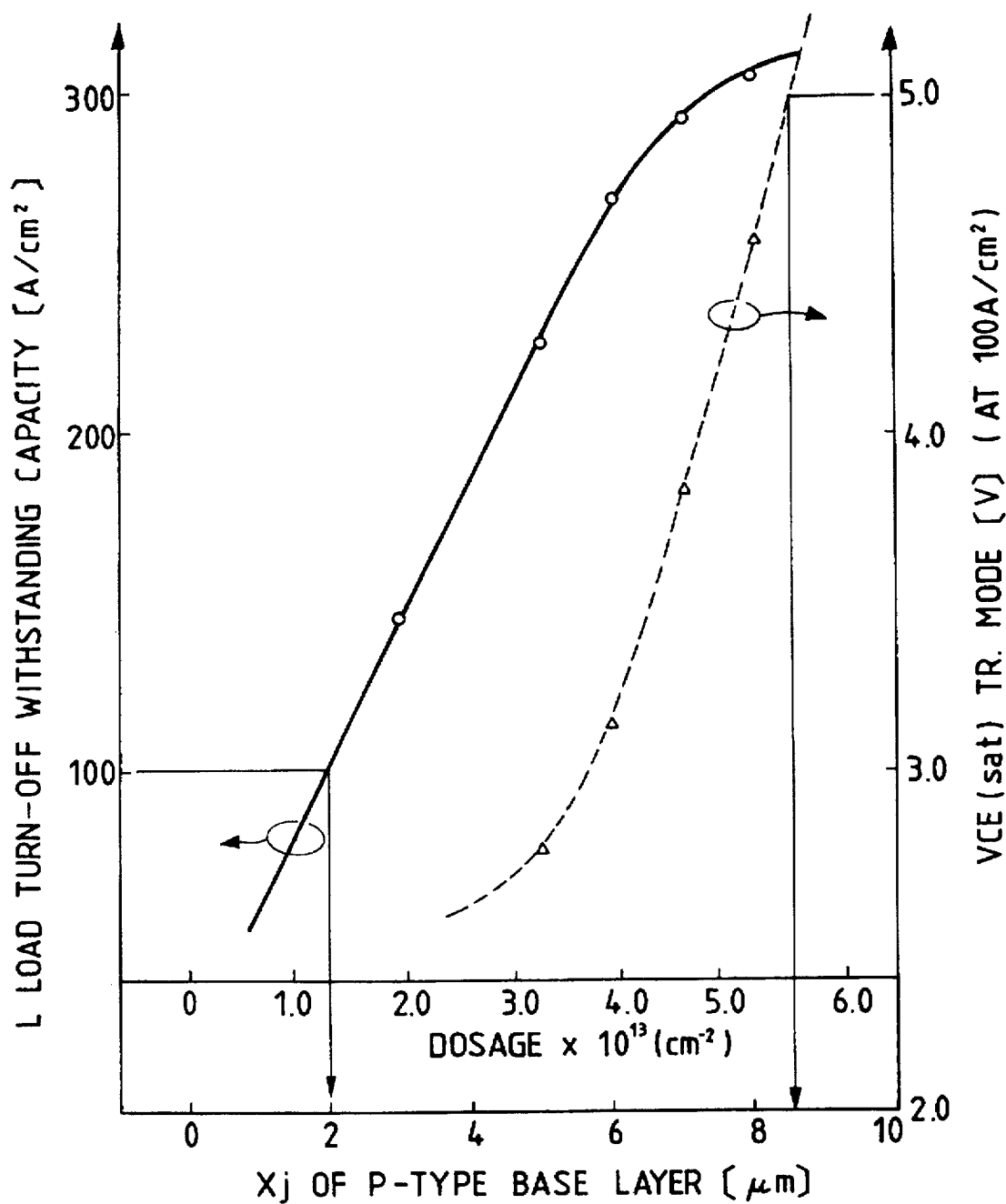
FIG. 26 is a graph illustrating the relationships of the L load turn-off withstand capability and the on-state voltage drop during transistor operation with respect to the diffusion depth $X_j$ of a p-type base layer in that semiconductor device of the second embodiment.
Figure 27:
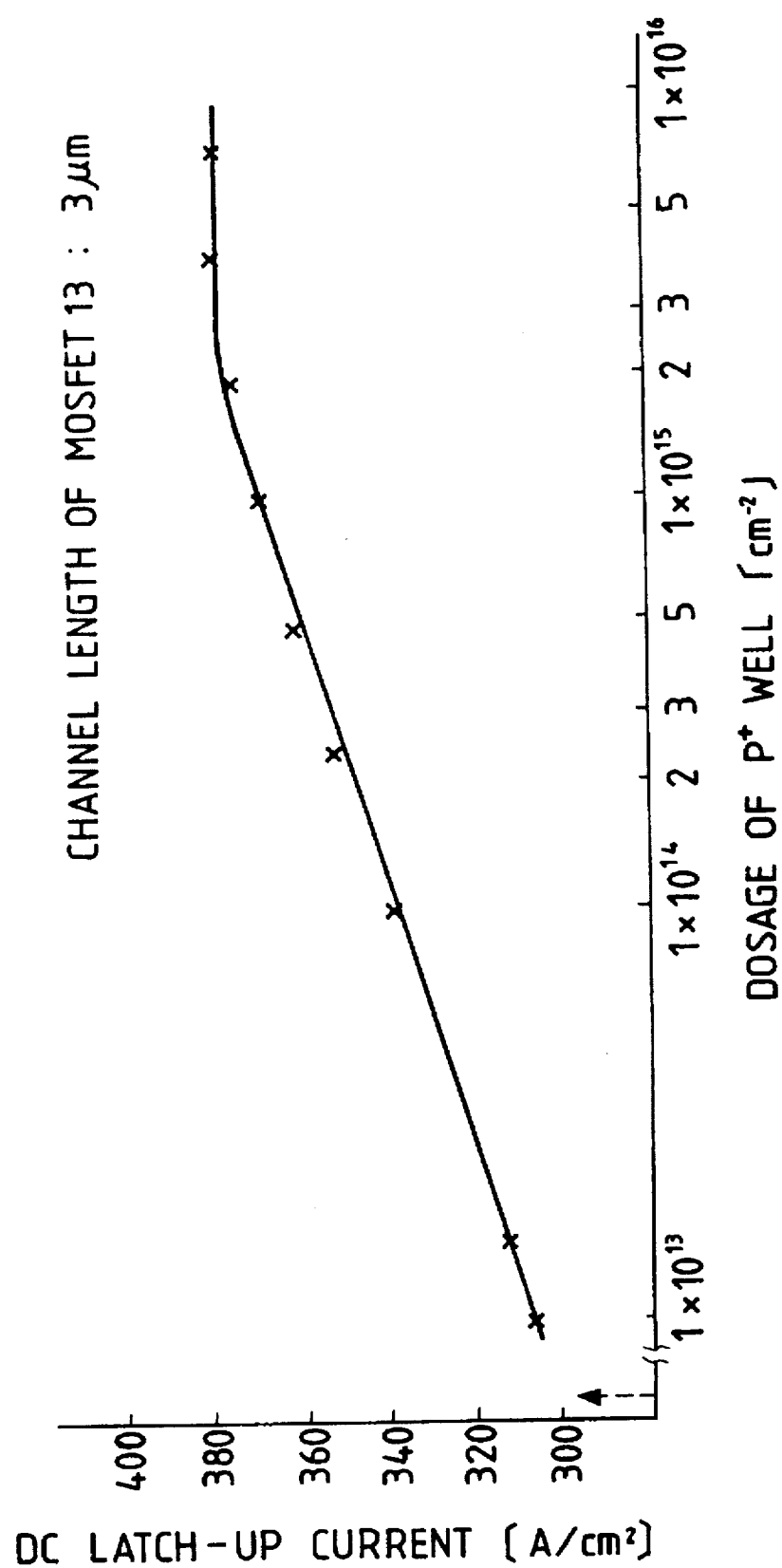
FIG. 27 is a graph illustrating DC latch-up current with respect to the dosage of a $p^+$ well in that semiconductor device of the second embodiment.

Accordingly, an examination will be made of optimum values of the dosage for the p-type base layer 4 and the diffusion depth thereof as well as the dosage for the p⁺ well 4a. FIG. 25 is a graph showing the relationships of an L load turn-off withstand capability and the on-state voltage drop (voltage drop) of the MOSFET 13 during a latch-up with respect to the dosage of the p-type base layer 4. The L load turn-off withstand capability is, in general, approximately one third of the latch-up current density during DC (direct current) operation, so that the L load latch-up current density may be used alternatively. It should be noted that the diffusion depth $X_j$ of the p-type base layer 4 is 6 µm, the surface concentration $C_S$ in the p⁺ well 4a is $1 \times 10^{19}$ cm⁻³, and its diffusion depth is set at 4 µm. In the actual use of this device, since 100 A/cm² or more is required as the L load turn-off withstand capability, as is evident from FIG. 25, a lower limit value of dosage in the p-type base layer 4 is preferably approximately $6 \times 10^{12}$ cm⁻². In addition, in order that the on-state voltage drop does not become too high, since a realistic on-state voltage drop of the MOSFET 13 is approximately 0.7 V or less, an upper limit value of dosage in the p-type base layer 4 is preferably approximately $1.2 \times 10^{14}$ cm⁻². Accordingly, the dosage in the p-type base layer 4 is preferably not less than $6 \times 10^{12}$ cm⁻² and not more than $1.2 \times 10^{14}$ cm⁻² irrespective of the presence or absence of the p⁺ well 4a. In the range of these numerical values, the latch-up withstand capability can be enhanced without increasing the on-state voltage drop during the thyristor operation. FIG. 26 is a graph showing the relationships of the L load turn-off withstand capability and the on-state voltage drop during the transistor operation with respect to the diffusion depth $X_j$ of the p-type base layer 4. It should be noted that the emitter-collector saturation voltage at the current value of 100 A/cm² is used as the on-state voltage drop. In addition, the surface concentration $C_S$ in the p-type base layer 4 is $2 \times 10^{17}$ cm⁻³, and the surface concentration $C_S$ in the p⁺ well 4a is $1 \times 10^{19}$ cm⁻³, the diffusion depth thereof being set at 4 µm. Since 100 A/cm² or more is required as the L load turn-off withstand capability, as is evident from FIG. 26, a lower limit value of the diffusion depth $X_j$ of the p-type base layer 4 is preferably approximately 2 µm. Since it is necessary for the on-state voltage drop to be 5 V or less in realistic terms, an upper limit value of the diffusion depth $X_j$ of the p-type base layer 4 is preferably approximately 8.5 µm. Accordingly, the diffusion depth $X_j$ of the p-type base layer 4 is preferably not less than 2 µm and not more than 8.5 µm. FIG. 27 is a graph showing the relationship of the DC latch-up current with respect to the dosage in the p⁺ well 4a. It should be noted that the channel length of the MOSFET 13 is set to 3 µm, and its on-resistance is set to a large level. As is evident from this drawing, if the dosage is increased, the base resistance $R_B$ decreases, so that a large latch-up current can be obtained.

If it is assumed that 100 A/cm² or more is required as the L load turn-off withstand capability, as described above, since the DC latch-up current is 300 A/cm² or more, the lower limit value of the dosage is approximately $1 \times 10^{13}$ cm⁻². Although, as for the upper limit value, a restriction cannot be read from this drawing, even if the dosage is increased, the latch-up current shows a tendency of saturation, and it is unrealistic to set it at not less than $1 \times 10^{16}$ cm⁻² to attain a short process time. Accordingly, the dosage in the p⁺ well 4a is preferably not less than $1 \times 10^{13}$ cm⁻² and not more than $1 \times 10^{16}$ cm⁻².

[Third Embodiment]

Figure 28:
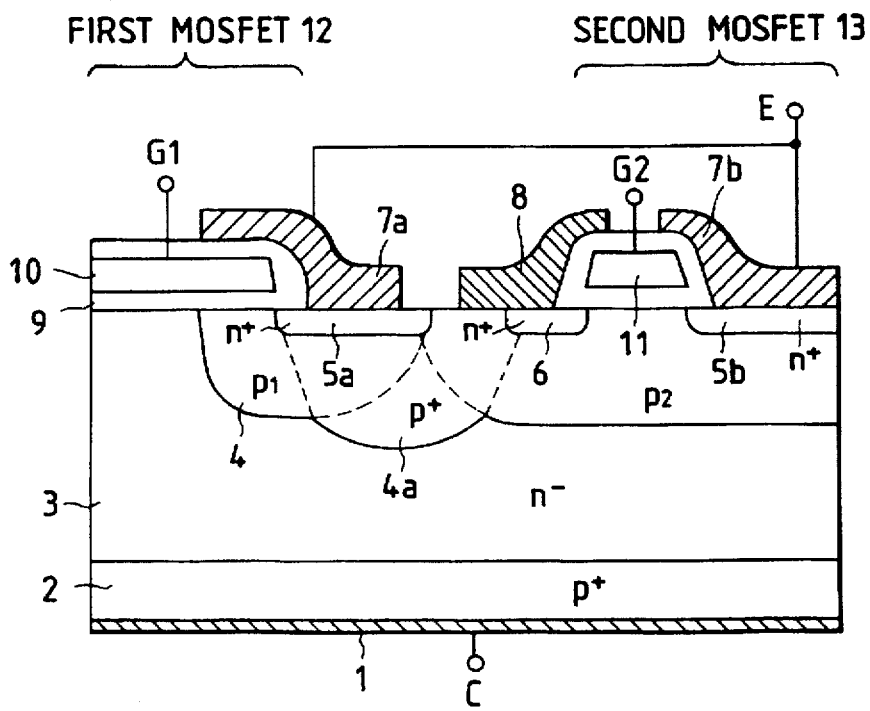
FIG. 28 is a cross-sectional view illustrating a configuration of a semiconductor device in accordance with a third embodiment of the present invention.

FIG. 28 shows a configuration of a semiconductor device having a double-gate structure comprising a first gate and a second gate in accordance with a third embodiment of the present invention. The arrangement and operation of the semiconductor device in this embodiment are substantially the same as those of the semiconductor device of the second embodiment, and a description of common portions will be omitted by denoting them by the same reference numerals. The device of the third embodiment is different from that of the second embodiment in the structure of the p-type base layer 14. In the device of this embodiment, the p-type base layer 14 is formed by a diffusion layer $p_1$ serving as a channel layer on the side where the first gate electrode 10 is disposed, a diffusion layer $P_2$ serving as a channel layer on the side where the second gate electrode 11 is disposed, and a high-concentration and slightly-deep diffusion layer ($p^+$ well) 4a serving as a boundary. The relationship of concentrations among the three diffusion layers is such that the concentration in the diffusion layer ($p^+$ well) 4a > the concentration in the diffusion layer $P_1 \geq$ the concentration in the diffusion layer $P_2$.

In the p-type base layer 4 in which the concentrations are thus adjusted, in the same way as in the semiconductor device of the second embodiment, because the high-concentration diffusion layer ($p^+$ well) 4a is provided in the p-type base layer 4, and also because the concentration of impurities in the diffusion layer $p_1$, which is the path of the hole current in the transistor state of the device and is located on the side where the first gate electrode 10 is disposed, is relatively high, the path of the hole current is provided with a lower resistance, thereby increasing the maximum current. In addition, the impurity concentration in the diffusion layer $p_2$ immediately below the second gate electrode 11 and immediately below the $n^+$-type emitter layer 5b is lower than the impurity concentration in the diffusion layer $p_1$, and its impurity concentration is such that the on-resistance of the second MOSFET 13 is maintained to a low level. Therefore, it is possible to obtain a large latch-up withstand capability while maintaining a low on-site voltage drop and, at the same time, it is possible to further reduce the turn-off time.

Figure 29:
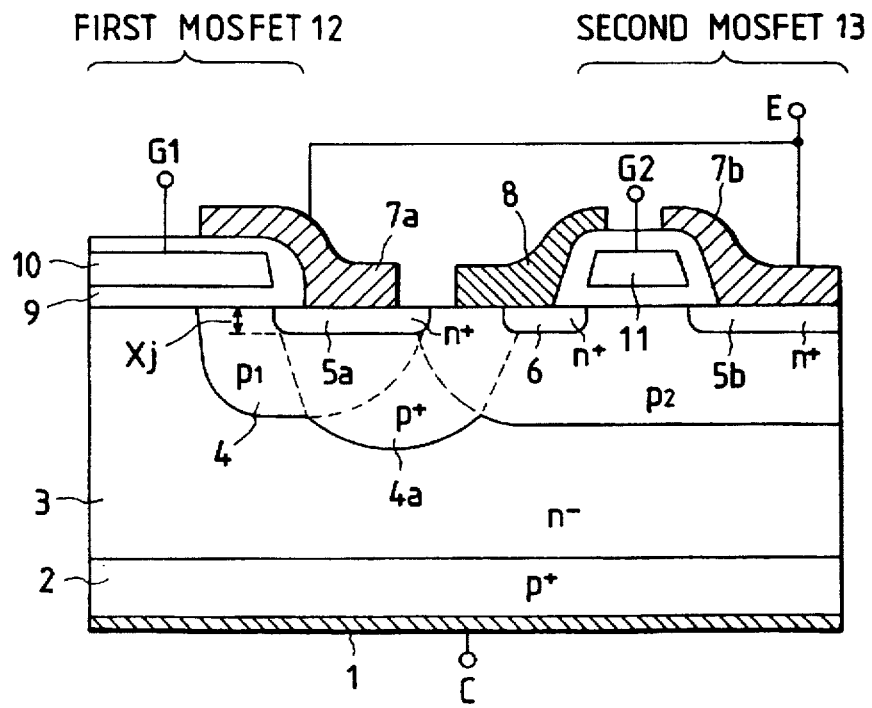
FIG. 29 is a cross-sectional view illustrating the diffusion depth $X_j$ of the first emitter layer in that semiconductor device of the third embodiment.
Figure 30:
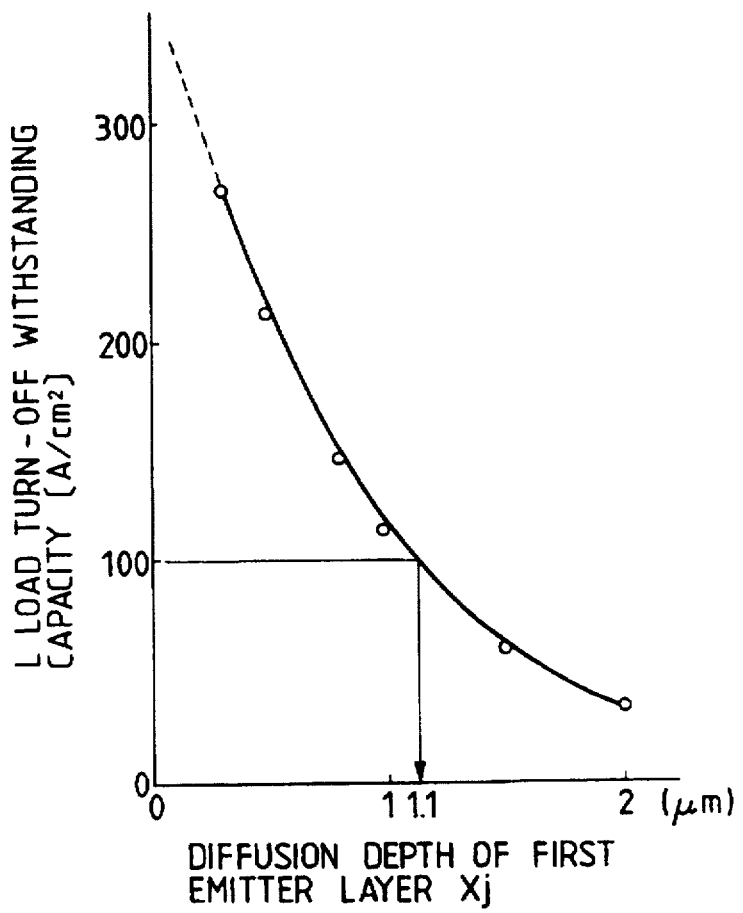
FIG. 30 is a graph illustrating the relationship of the L load turn-off withstand capability with respect to the diffusion depth $X_j$ of the first emitter layer in that semiconductor device of the third embodiment.
Figure 33:
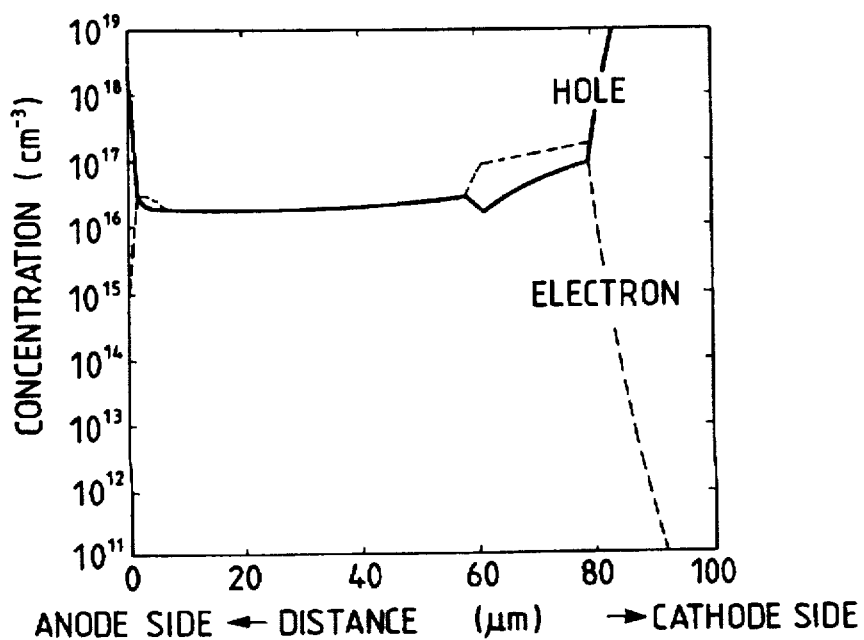
FIG. 33 is a graph illustrating the carrier concentration in the MCT shown in FIG. 31.
Figure 31:
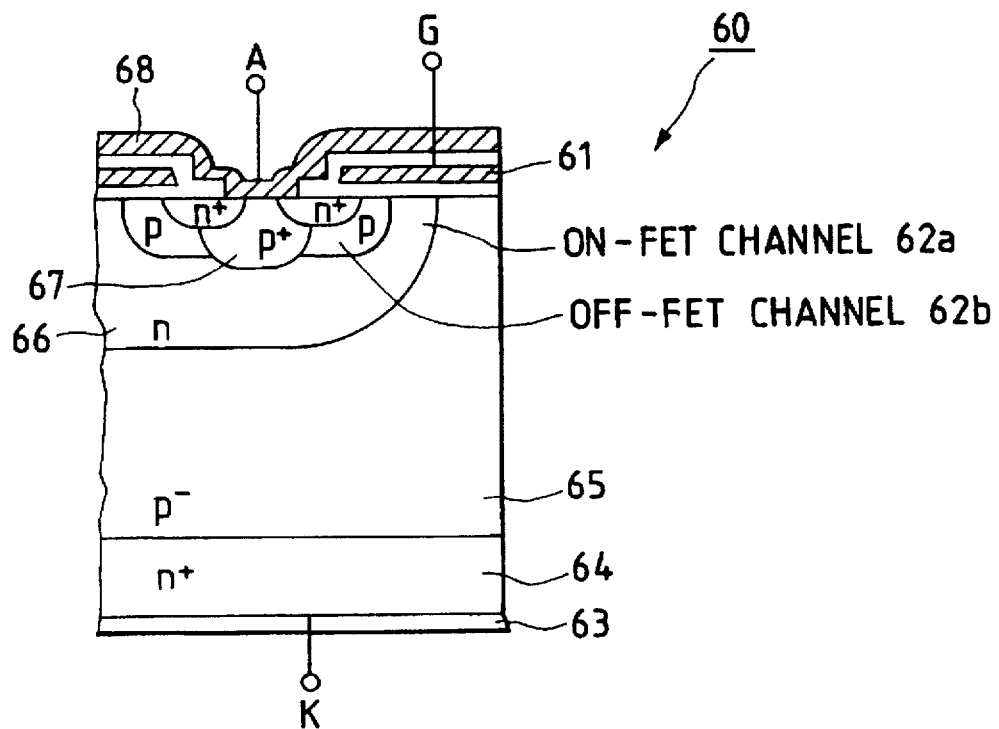
FIG. 31 is a cross-sectional view illustrating an example of the structure of an MCT.
Figure 32:
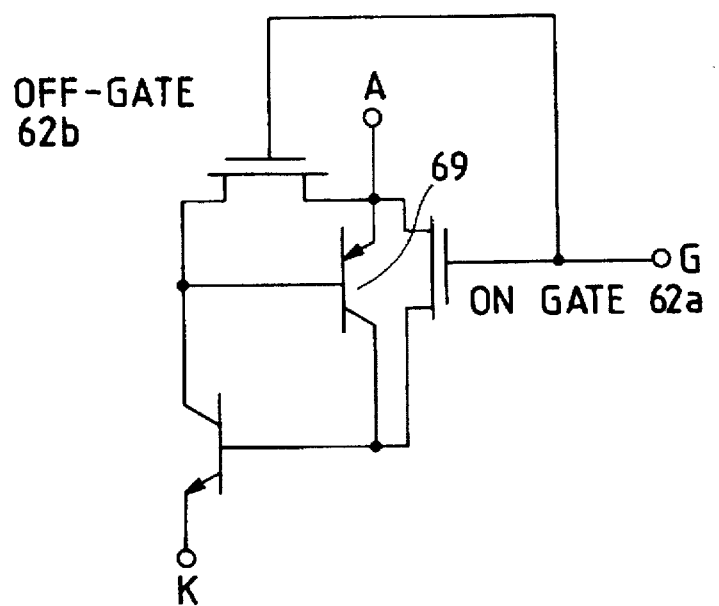
FIG. 32 is a circuit diagram illustrating an equivalent circuit of the MCT shown in FIG. 31.
Figure 34:
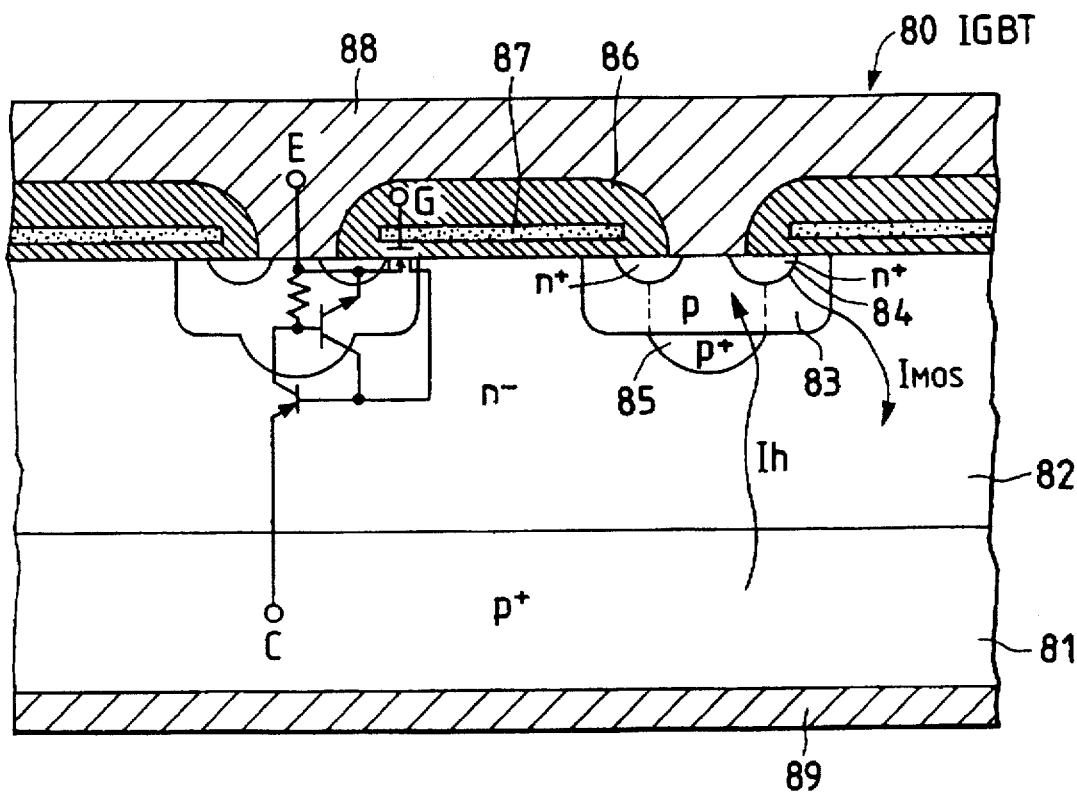
FIG. 34 is a cross-sectional view illustrating an example of the structure of an IGBT.
Figure 35:
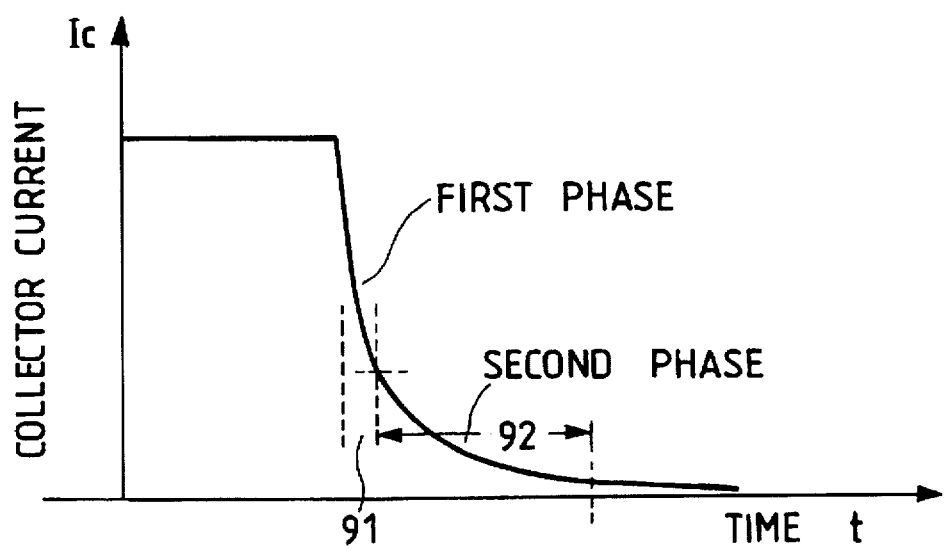
FIG. 35 is a graph illustrating the turn-off waveform of the IGBT shown in FIG. 34.
Figure 36:
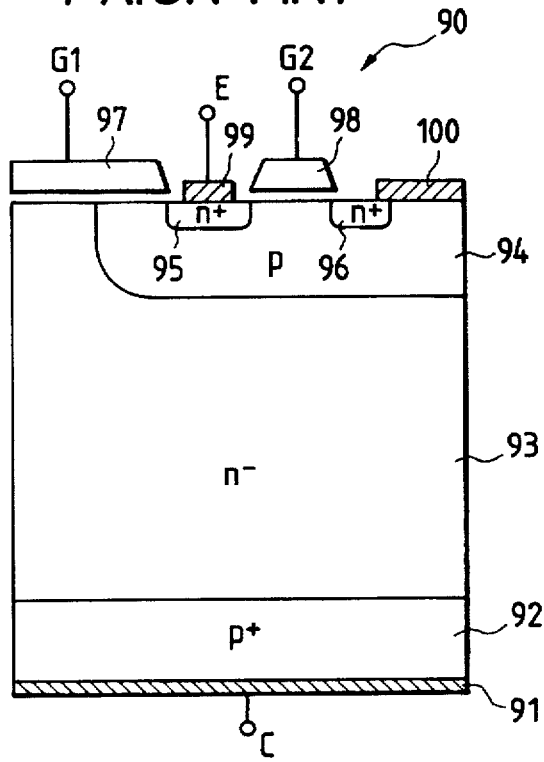
FIG. 36 is a cross-sectional view illustrating an example of the structure of a conventional double-gate semiconductor device.
Figure 37A:
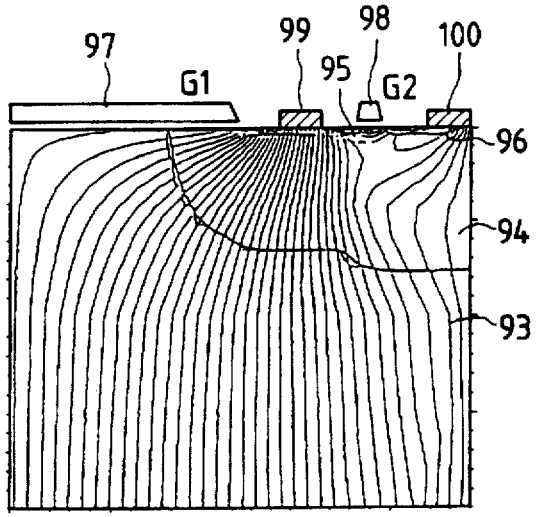
FIG. 37(a) is a cross-sectional view illustrating the flow of current in the thyristor state of the semiconductor device shown in FIG. 36.
Figure 37B:
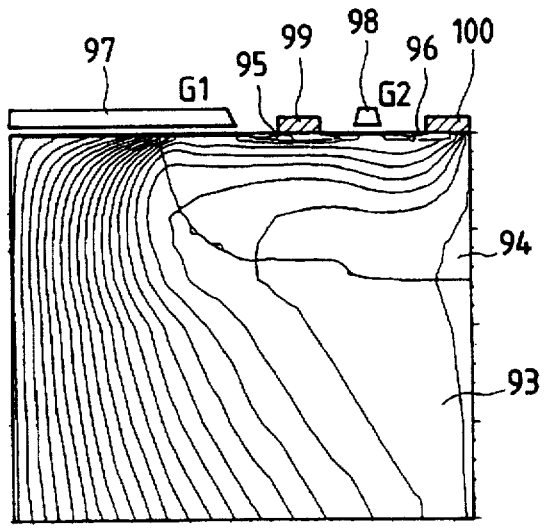
FIG. 37(b) is a cross-sectional view illustrating the flow of current in the transistor state of that semiconductor device shown in FIG. 36.

Here, an optimum value of the diffusion depth $X_j$ of the second emitter layer 5a will be described (see FIG. 29). In the first embodiment, it has been described that if the diffusion depth $X_j$ of the emitter layer 5a is made shallow, the latch-up withstand capability can be increased since the emitter resistance is favorably parasitic. Also, if the diffusion depth $X_j$ of the emitter layer 5a is made shallow, the surface depth of the diffusion layer $p_1$ relatively moves toward a deeper portion owing to the effect of the skin drop, so that the value of the base resistance $R_B$ decreases due to the substantial enlargement of the cross-sectional area of the diffusion layer $p_1$, thereby making it possible to increase the latch-up withstand capability. FIG. 30 is a graph illustrating the relationship of the L load turn-off withstand capability with respect to the diffusion depth $X_j$ of the first emitter layer 5a. It should be noted that the surface concentration at the first emitter layer 5a is $1 \times 10^{20}$ cm$^{-3}$, while the surface concentration at the p-type base 4 is $1 \times 10^{17}$ cm$^{-3}$ and its diffusion depth is set to 6 µm. As is evident from this drawing, if the lower limit value of the L load turn-off withstand capability is assumed to be 100 A/cm$^2$, the upper limit value of the diffusion depth $X_j$ of the first emitter layer 5a is approximately 1.1 µm. Although there is no restriction as the lower limit value, since there are cases where the first emitter layer 5a is over-etched by 0.1 µm in the formation of the first emitter electrode 7a, a diffusion depth of 0.1 µm or more is considered desirable for the first emitter layer 5a before etching. Accordingly, it is desired that the diffusion depth $X_j$ of the first emitter layer 5a be not less than zero and not more than 1.1 µm.

It should be noted that, in the first to third embodiments, a description has been given on the basis of a vertical-type device in which the emitter electrode and the collector electrode are disposed on the obverse and reverse surfaces of the device, respectively, the present invention is not limited to the same and can, of course, be realized in a horizontal-type device in which the emitter electrode and the collector electrode are disposed on the same surface. In addition, it goes without saying that it is possible to adopt various arrangements in the configuration of the base layers and the emitter layer, and to adopt various arrangements in the configuration of the first and second MOSFETs as well.

As described above, in the semiconductor device in accordance with the present invention, by using the first MISFET and the second MISFET, a low on-state voltage drop similar to that of the thyristor can be realized during a turn-on, and a short switching time similar to that of the IGBT can be realized during a turn-off. In addition, in the semiconductor device in accordance with the present invention, since not only the source region of the first MISFET but also the source region of the second MISFET formed at a position spaced apart therefrom are provided as regions to both of which the emitter potential (cathode potential) is applied, it is possible to allow the main current to flow through different paths in both the thyristor state and the transistor state. Namely, since the main current is allowed to flow to the source region side of the second MISFET in the thyristor state and to the source region side of the first MISFET in the transistor state, respectively, the current path in the transistor state during a turn-off can be set to a low resistance, so that the latch-up can be suppressed, and the amount of controllable current can be increased.

Hence, in accordance with the present invention, it becomes possible to substantially enhance the performance of the power device used in apparatuses and circuits of medium or large current and medium and high voltage resistance. In addition, since the on-state voltage drop is low and the switching speed is high, it is possible to substantially reduce the loss even in high-frequency applications.

In a case where the drain region of the second MISFET is formed between the source region of the first MISFET and the source region of the second MISFET which are formed in mutually spaced-apart relation, the path of outflow of the hole current from the third semiconductor region of the first conductivity type to the drain region of the second conductivity type is shortened. Hence, it is possible to increase the latch-up withstand capability of the device and to improve the turn-off characteristics.

In addition, since a first conductivity-type high-concentration semiconductor region is formed between the region where the first MISFET gate electrode is disposed and the region where the second MISFET gate electrode is disposed within the the third semiconductor region of the first conductivity type, it is possible to reduce the resistance in the outflow of majority carriers, and it is possible to increase the maximum current which is allowable in the transistor state. In addition, it is possible to reduce the time duration for a transition from the thyristor state to the transistor state, and the turn-off time of the device can be reduced further.

In a case where the third semiconductor region is constituted by the semiconductor region where the gate electrode of the first MISFET is disposed, the high-concentration semiconductor region of the first conductivity type, and the semiconductor region where the gate electrode of the second MISFET is disposed, and the relationships of impurity concentrations are set such that the concentration of the high-concentration semiconductor region > the concentration of the semiconductor region where the gate electrode of the first MISFET is disposed ≧ the concentration of the semiconductor region where the gate electrode of the second MISFET is disposed, then threshold values and the like of the first MISFET and the second MISFET can be controlled individually, and the outflow of carriers can be effected with low resistance while maintaining a low on-state voltage drop. Hence, characteristics of the device in both the thyristor state and the transistor state improve.

What is claimed is:

1. A semiconductor device chip, comprising:
    a thyristor structure comprising a first semiconductor region of a first conductivity type, a second semiconductor region of a second conductivity type, a third semiconductor region of the first conductivity type, and a fourth semiconductor region of the second conductivity type including first and second portions;
    a first MISFET capable of injecting majority carriers of a second type into said second semiconductor region and including a first source region provided in said first portion of said fourth semiconductor region; and
    a second MISFET capable of being opened or closed independently of said first MISFET and capable of drawing out majority carriers of a first type from said third semiconductor region, said second MISFET including:
        a second source region provided in said second portion of said fourth semiconductor region in spaced relation to said first source region, and
        a drain region located between said first and second source regions, and
    a shortcircuiting electrode contacting said drain region of said second MISFET and said third semiconductor region at a location between said first source region and said drain region;
    a first gate main wiring disposed along a first side of said semiconductor device chip;
    a second gate main wiring disposed along a second side of said semiconductor device chip opposite said first side;
    a first branch line in a form of first comb teeth branching out from said first gate main wiring; and
    a second branch line in a form of second comb teeth branching out from said second gate main wiring with pairs of said second comb teeth interleaved with adjacent pairs of said first comb teeth,
    wherein said first branch line provides a gate electrode of said first MISFET, and said second branch line provides a gate electrode of said second MISFET.

2. The semiconductor device chip according to claim 1, wherein said third semiconductor region includes a first portion having a high concentration of the first conductivity type disposed between a second portion of the third semiconductor region beneath the gate electrode of said first MISFET and a third portion of the third semiconductor region beneath the gate electrode of said second MISFET.

3. The semiconductor device chip according to claim 2, wherein said first portion of said third semiconductor region has an impurity concentration greater than an impurity concentration of said second portion of said third semiconductor region and greater than or equal to an impurity concentration of said third portion of said third semiconductor region.

4. The semiconductor device chip according to claim 2, wherein a dosage in said first portion of said third semiconductor region of the first conductivity type is not less than $1 \times 10^{13}$ cm$^{-2}$ and not more than $1 \times 10^{16}$ cm$^{-2}$.

5. The semiconductor device chip according to claim 1, wherein a dosage in said third semiconductor region of the first conductivity type is not less than $6 \times 10^{12}$ cm$^{-2}$ and not more than $1.2 \times 10^{14}$ cm$^{-2}$.

6. The semiconductor device chip according to claim 1, wherein a diffusion depth of said third semiconductor region is not less than 2 μm and not more than 8.5 μm.

7. The semiconductor device chip according to claim 1, wherein a diffusion depth of said first source region of said first MISFET is not more than 1.1 μm.

8. The semiconductor device chip according to claim 1, further comprising voltage increasing means for increasing a potential of said first source region of said first MISFET by a predetermined potential as compared with a potential of said second source region of said second MISFET.

9. The semiconductor device chip according to claim 8, wherein said voltage increasing means comprises a high-resistance polycrystalline silicon layer contacting said first source region of said first MISFET.

10. The semiconductor device chip according to claim 8, wherein said voltage increasing means comprises a diffusion resistance of said first source region of said first MISFET.

11. The semiconductor device chip according to claim 8, wherein said voltage increasing means comprises a Schottky contact constituted by said first source region of said first MISFET being contacted by a metal electrode on a surface of said first source region.

12. The semiconductor device chip according to claim 1, wherein said gate electrode of said second MISFET is a metal gate electrode.

13. The semiconductor device chip according to claim 1, wherein said gate electrode of said second MISFET is a silicide gate electrode.

14. The semiconductor device chip according to claim 1, wherein a source electrode wiring of said first MISFET and a source electrode wiring of said second MISFET comprise a single-layered wiring structure.

15. The semiconductor device chip according to claim 1, wherein a source electrode wiring of said first MISFET and a source electrode wiring of said second MISFET comprise a two-layered wiring structure.

* * * * *

UNITED STATES PATENT AND TRADEMARK OFFICE
CERTIFICATE OF CORRECTION

PATENT NO. : 5,714,774
DATED : February 03, 1998
INVENTOR(S) : Masahito OTSUKI et al.

It is certified that error appears in the above-indentified patent and that said Letters Patent is hereby corrected as shown below:

On title page, item [54] and col. 1, line 1, in the title
"SEMICONDUCTOR POWER" should read --POWER SEMICONDUCTOR--.

Signed and Sealed this

Tenth Day of August, 1999

Attest:

Q. TODD DICKINSON

Attesting Officer

Acting Commissioner of Patents and Trademarks